United States Patent
Saeki

(10) Patent No.: US 6,836,010 B2
(45) Date of Patent: Dec. 28, 2004

(54) SEMICONDUCTOR DEVICE INCLUDE RELAY CHIP CONNECTING SEMICONDUCTOR CHIP PADS TO EXTERNAL PADS

(75) Inventor: Yoshihiro Saeki, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 10/347,357

(22) Filed: Jan. 21, 2003

(65) Prior Publication Data

US 2004/0017003 A1 Jan. 29, 2004

(30) Foreign Application Priority Data

Jul. 24, 2002 (JP) ........................................ 2002-214615

(51) Int. Cl.[7] .............................................. H01L 23/48
(52) U.S. Cl. ........................ 257/694; 257/685; 257/686; 257/690; 257/692; 257/693
(58) Field of Search ................................ 257/685–686, 257/692–693, 690, 694

(56) References Cited

U.S. PATENT DOCUMENTS

| | | | | |
|---|---|---|---|---|
| 5,814,881 A | * | 9/1998 | Alagaratnam et al. | 257/686 |
| 5,815,372 A | * | 9/1998 | Gallas | 361/760 |
| 5,861,668 A | * | 1/1999 | Cha | 257/692 |
| 5,989,939 A | * | 11/1999 | Fjelstad | 438/117 |
| 6,118,176 A | * | 9/2000 | Tao et al. | 257/676 |
| 6,316,838 B1 | * | 11/2001 | Ozawa et al. | 257/778 |
| 6,333,566 B1 | * | 12/2001 | Nakamura | 257/790 |
| 2002/0113306 A1 | * | 8/2002 | Huang | 257/690 |
| 2002/0141130 A1 | * | 10/2002 | Lyke et al. | 361/160 |
| 2002/0153600 A1 | * | 10/2002 | Chang et al. | 257/676 |

FOREIGN PATENT DOCUMENTS

| | | |
|---|---|---|
| JP | 5013490 | 1/1993 |
| JP | 5121634 | 5/1993 |
| JP | 06-349981 | 12/1994 |
| JP | 10326850 | 12/1998 |
| JP | 11-003970 | 1/1999 |
| JP | 11-220091 | 8/1999 |
| JP | 2000-332194 | 11/2000 |
| JP | 2001-007277 | 1/2001 |

* cited by examiner

*Primary Examiner*—Amir Zarabian
*Assistant Examiner*—Ida M. Soward
(74) *Attorney, Agent, or Firm*—Volentine Francos & Whitt, PLLC

(57) ABSTRACT

Disposal and replacement of bonding pads is conducted easily and accurately. A semiconductor chip that includes bonding pads is fixed on a die pad. A relay chip is fixed on the semiconductor chip via an insulating material. The relay chip includes bonding pads that are interconnected via a wiring pattern, which includes a single-layer or multi-layer interconnection structure, and convert the disposition of the bonding pads of the semiconductor chip to a different direction. The bonding pads of the semiconductor chip are connected to the bonding pads of the relay chip via wires, and the bonding pads of the relay chip are connected to bonding pads of a lead frame via wires.

18 Claims, 23 Drawing Sheets

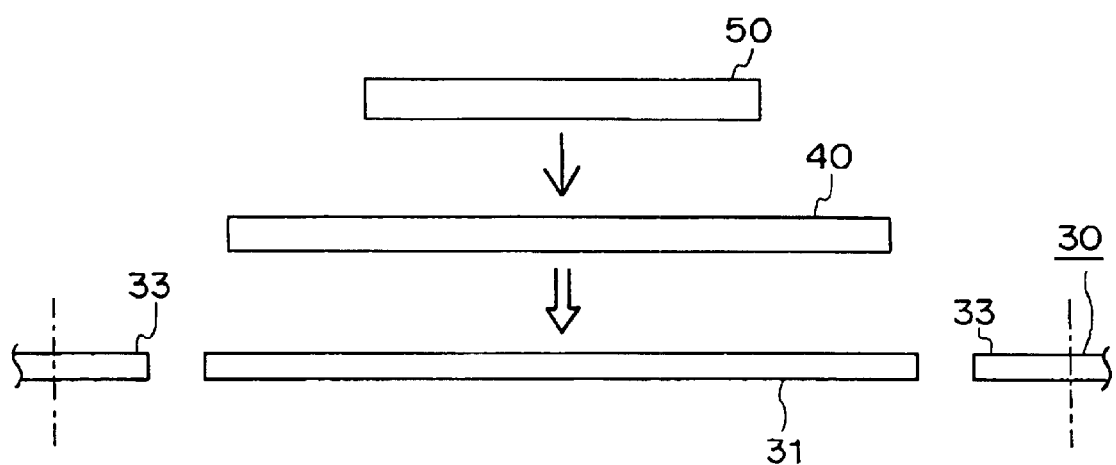
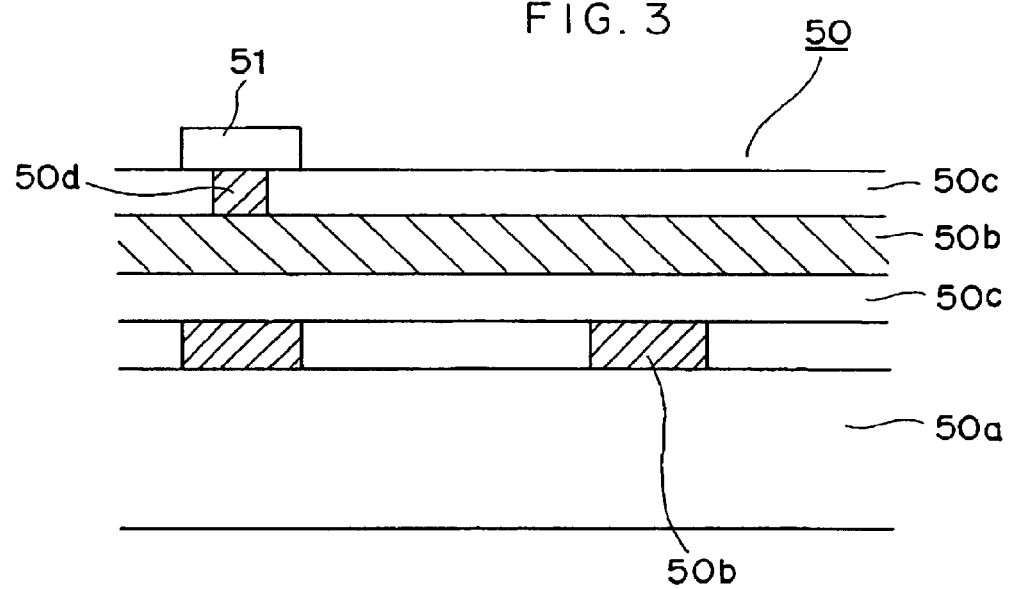

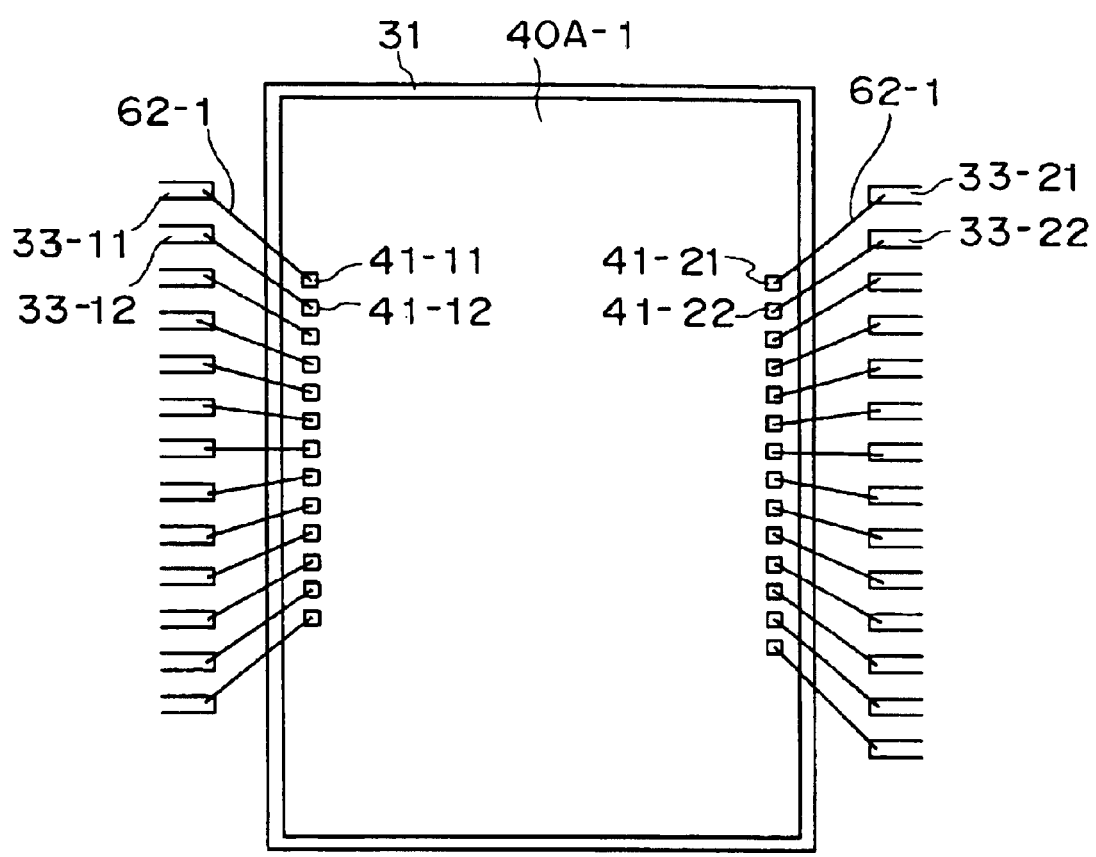
F I G. 6A

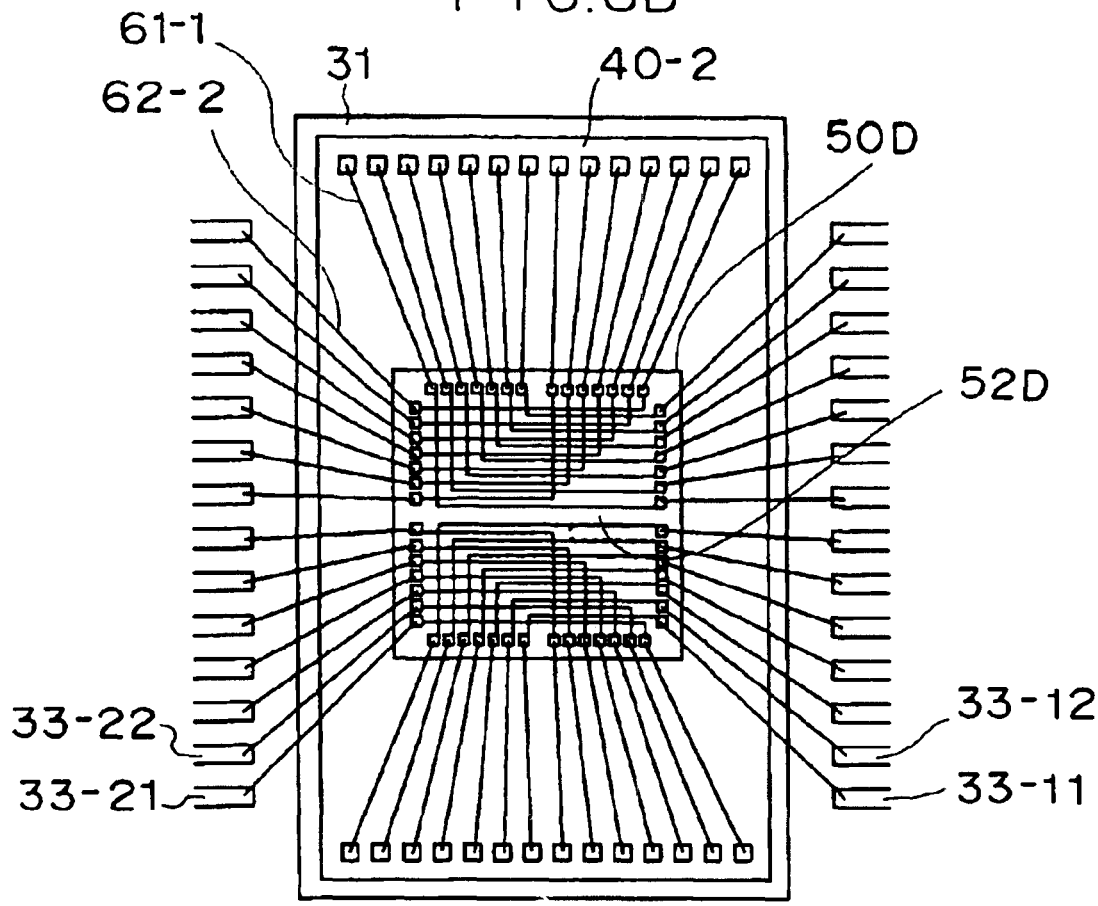
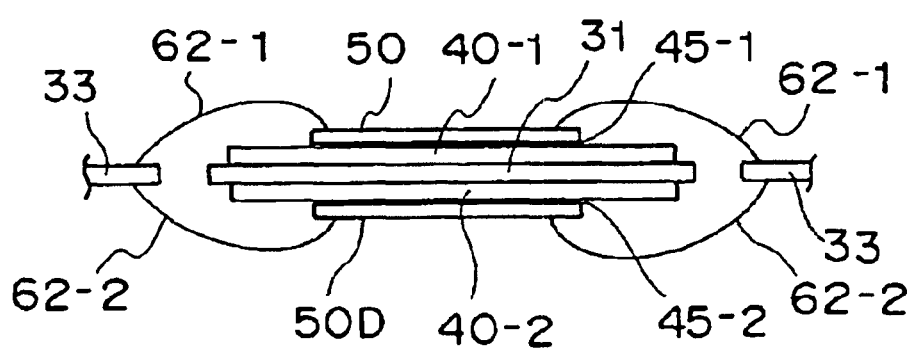

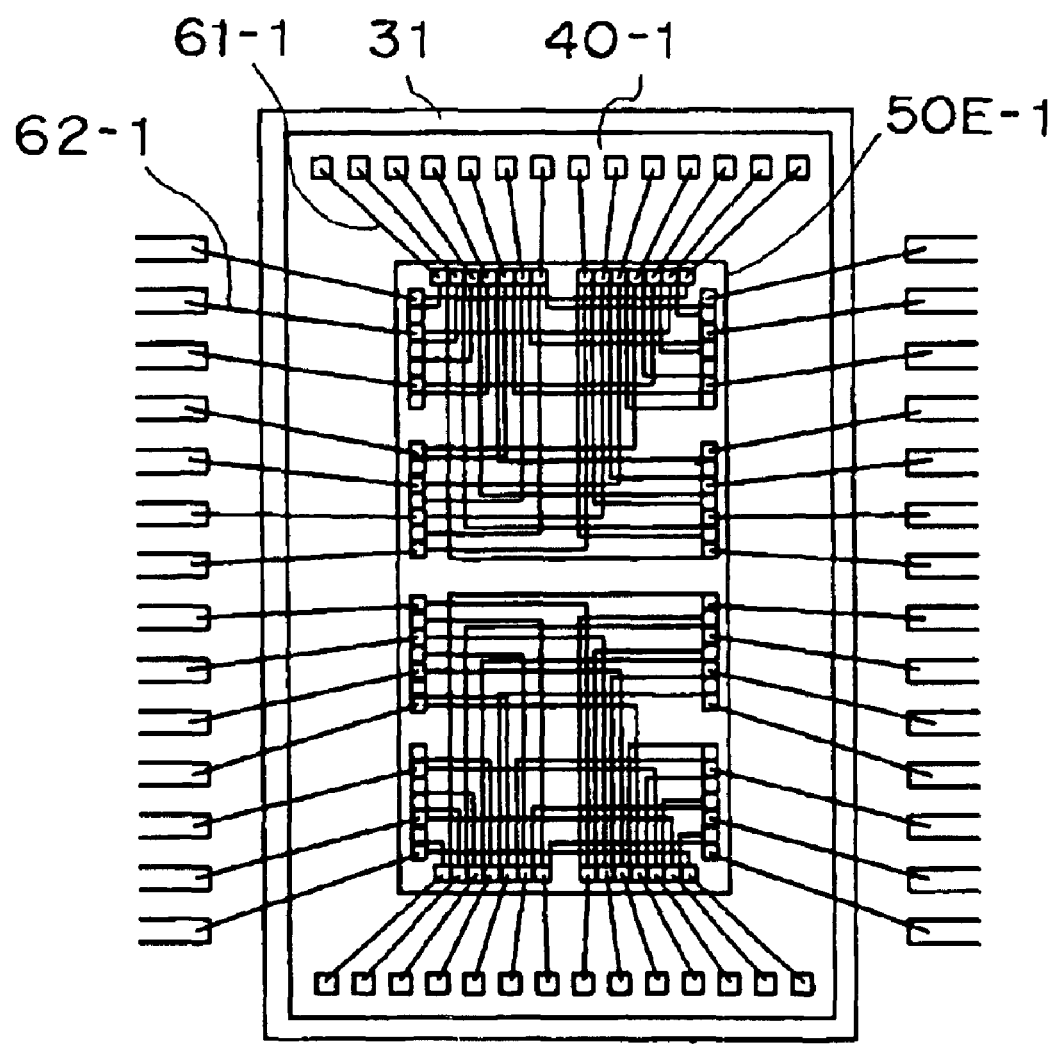

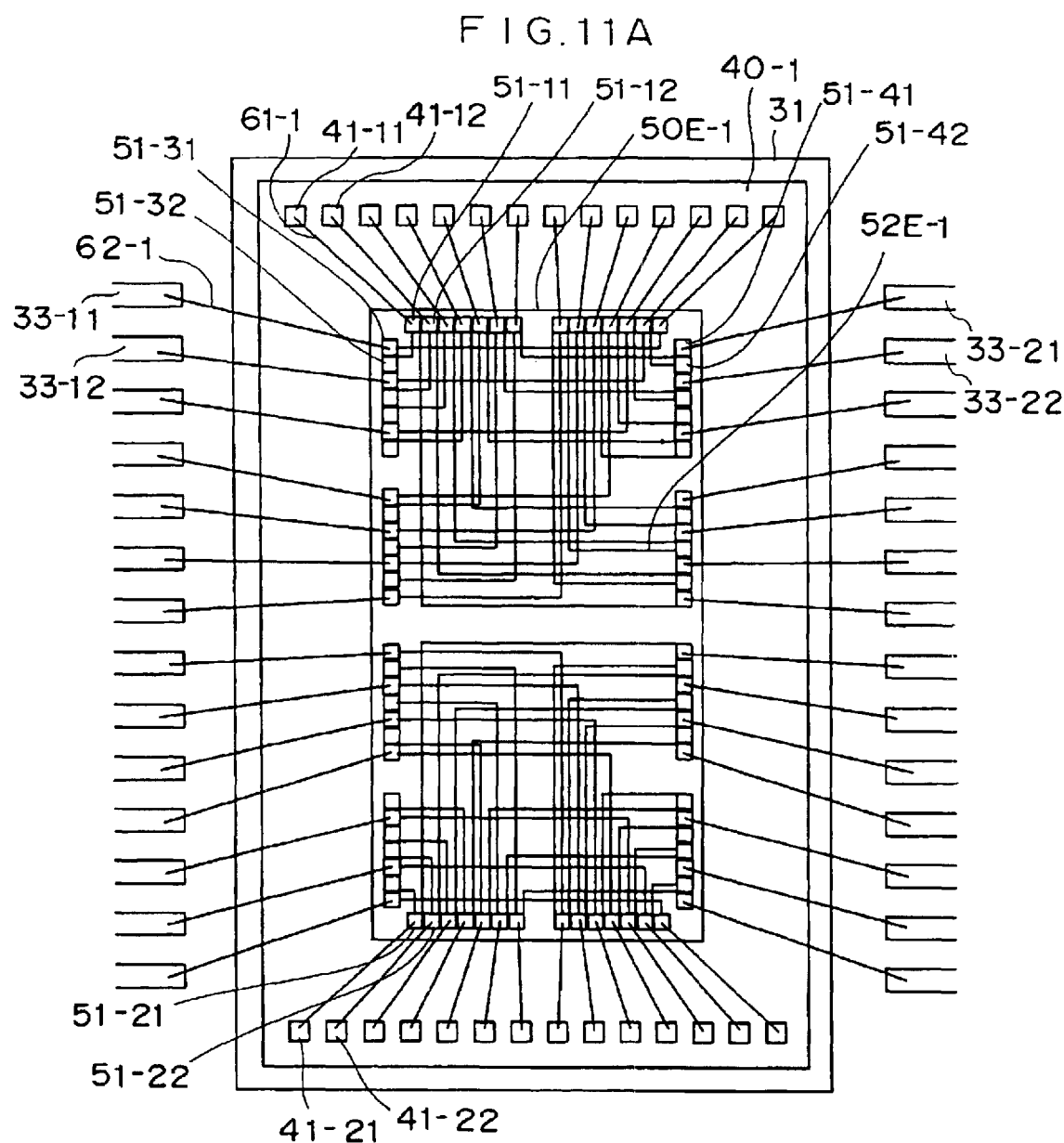

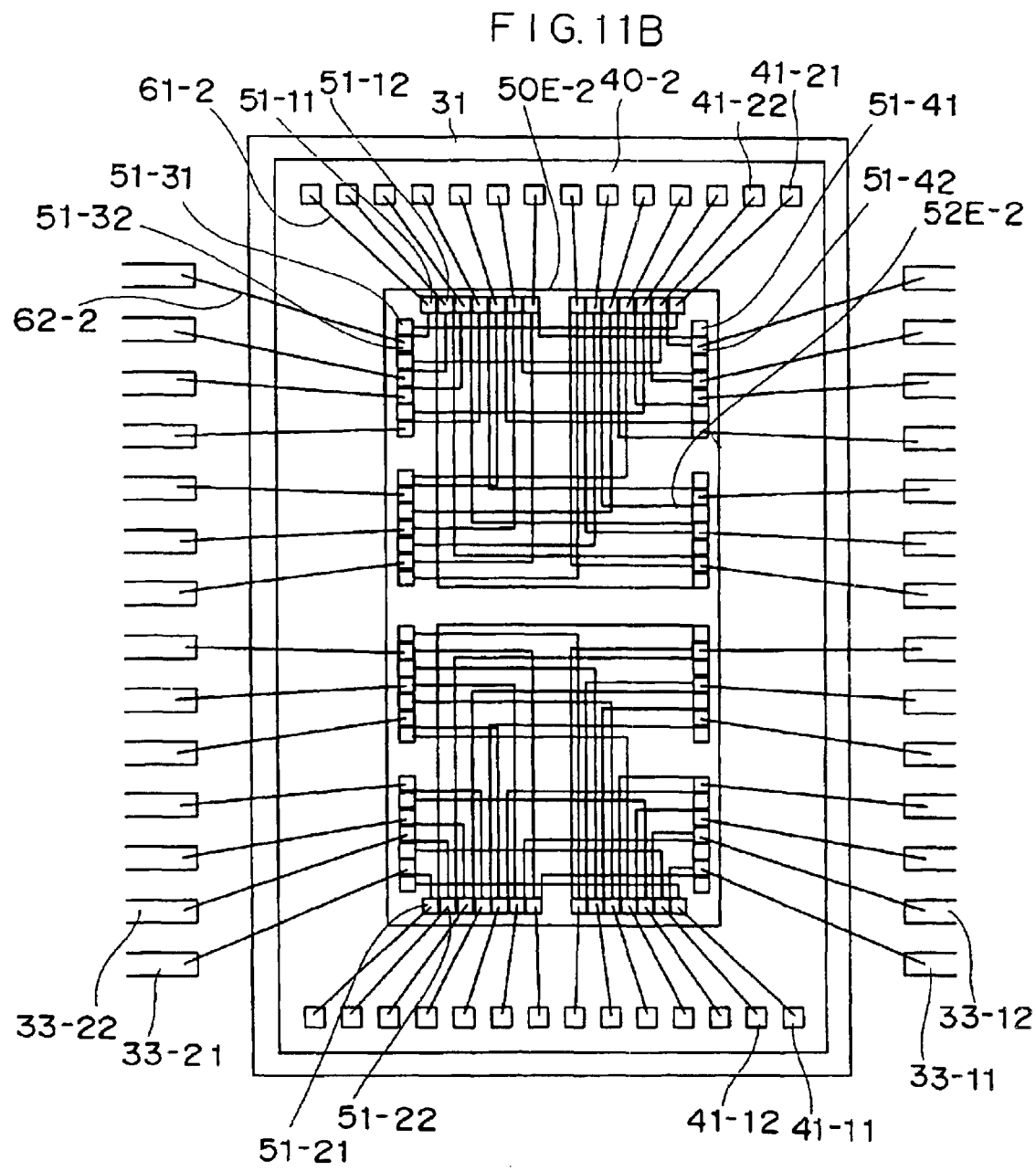

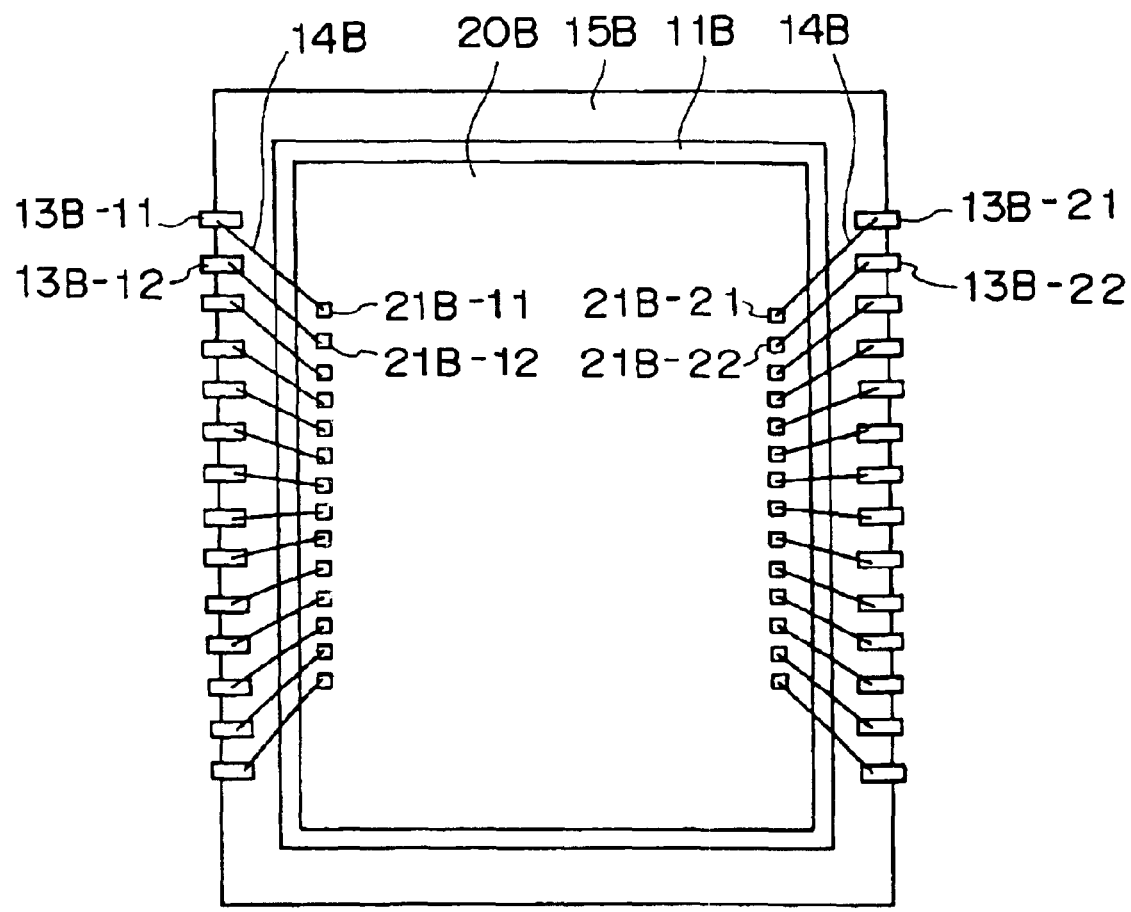

SEMICONDUCTOR DEVICE INCLUDE RELAY CHIP CONNECTING SEMICONDUCTOR CHIP PADS TO EXTERNAL PADS

BACKGROUND OF THE INVENTION

1. Field of the Invention

The present invention relates to a semiconductor device mounted by wire bonding and to a method of producing the semiconductor device.

2. Description of the Related Art

Conventionally, semiconductor devices of a package configuration, such as the Small Outline Package (SOP), the Dual Inline Package (DIP), the Pin Grid Array (PGA), and the Quad Flat Package (QFP), which all accommodate a semiconductor chip in a package, have been known. Moreover, various semiconductor devices of a multi-chip package configuration, in which several semiconductor chips are accommodated in a single package, have been proposed in order to improve packaging density.

Examples of documents concerning semiconductor devices of the multi-chip package configuration include the following.

Document 1: Japanese Patent Application Laid-open Publication (JP-A) No. 2000-332194

Document 2: Japanese Patent Application Laid-open Publication (JP-A) No. 2001-7277

FIGS. 14A and 14B are schematic structural views of a conventional SOP semiconductor device, with FIG. 14A being a plan view and FIG. 14B being a longitudinal sectional view. FIGS. 15A and 15B are schematic structural views of another conventional SOP semiconductor device in which exterior pull-out lead positions are different from those of FIGS. 14A and 14B, with FIG. 15A being a plan view and FIG. 15B being a longitudinal sectional view.

In the semiconductor device of FIGS. 14A and 14B, a semiconductor chip 20A is mounted using a lead frame 10A. As shown in FIG. 14A, the lead frame 10A includes a die pad 11A for mounting a semiconductor chip, with the die pad 11A being substantially rectangular in plan view. A plurality of leads 12A are vertically disposed a predetermined distance away from upper and lower edges of the die pad 11A. Each lead 12A includes an inner lead portion disposed with a bonding pad 13A and an outer lead portion that is pulled out to the exterior.

The semiconductor chip 20A, which is rectangular when seen in plan view, is fixed on the die pad 11A. As seen in FIG. 14A, bonding pads 21A are disposed near upper and lower edges of an upper surface of the semiconductor chip 20A in correspondence to the positions at which the bonding pads 13A of the lead frame 10A are disposed. The bonding pads 21A of the semiconductor chip 20A are connected to the bonding pads 13A of the lead frame 10A by wires 14A. The semiconductor chip 20A and the wires 14A are resin-sealed with a resin member 15A.

Because the semiconductor device of FIGS. 15A and 15B is packaged using a lead frame 10B, in which the pull-out direction of the leads is different from that of the lead frame 10A of FIGS. 14A and 14B, a semiconductor chip 20B is used in which the positions at which the bonding pads are disposed are different from those of the semiconductor chip 20A of FIGS. 14A and 14B.

Namely, in the lead frame 10B of FIGS. 15A and 15B, plural leads 12B are, as shown in FIG. 15A, horizontally disposed at a predetermined distance away from left and right edges of a die pad 11B, which is rectangular in plan view. Each lead 12B includes an inner lead portion disposed with a bonding pad 13B and an outer lead portion that is horizontally drawn out.

Although the semiconductor chip 20B, which is rectangular in plan view and fixed on the die pad 11B, has a function that is identical to that of the semiconductor chip 20A of FIGS. 14A and 14B, it is newly created distinct from the semiconductor chip 20A of FIGS. 14A and 14B so that the bonding pads 21B are disposed near left and right edges of the upper surface in order to correspond to the positions at which the bonding pads 13B of the lead frame 10B are disposed. After the bonding pads 21B of the semiconductor chip 20B have been connected to the bonding pads 13B of the lead frame 10B by wires 14B, the semiconductor chip 20B and the wires 14B are resin-sealed with a resin member 15B.

FIGS. 16A, 16B and 16C are schematic structural views showing a semiconductor device of a conventional multi-chip package configuration, with FIG. 16A being a plan view seen from an upper surface, FIG. 16B being a bottom view seen from an undersurface, and FIG. 16C being a longitudinal sectional view. Elements in common with elements of FIGS. 15A and 15B are designated by common reference numerals.

In this semiconductor device, semiconductor chips 20B and 20C that have the same function are mounted on an upper surface and on an undersurface of the die pad 11B of the lead frame 10B of FIGS. 15A and 15B for the purpose of, for example, doubling memory capacity.

As shown in FIG. 16A, the lead frame 10B includes the die pad 11B, which is rectangular in plan view, and plural leads 12B that are horizontally disposed at a predetermined distance away from left and right edges of the die pad 11B. The leads 12B include inner lead portions disposed with bonding pads 13B (left-side bonding pads 13B-11, 13B-12, . . . , and right-side bonding pads 13B-21, 13B-22, . . . ) and outer lead portions that are horizontally pulled out.

Bonding pads 21B (left-side bonding pads 21B-11, 21B-12, . . . , and right-side bonding pads 21B-21, 21B-22, . . . ) are disposed near left and right edges of an upper surface of the semiconductor chip 20B on the upper side of the die pad 11B in correspondence to the bonding pads 13B-11, 13B-12, . . . , 13B-21, 13B-22, . . . of the lead frame 10B. The left-side bonding pads 21B-11, 21B-12, . . . are connected to the left-side bonding pads 13B-11, 13B-12, . . . of the lead frame 10B via plural wires 14B. The right-side bonding pads 21B-21, 21B-22, . . . are connected to the right-side bonding pads 13B-21, 13B-22, . . . of the lead frame 10B.

When a semiconductor chip having the same structure (i.e., when the disposition of the bonding pads thereof is the same) as that of the semiconductor chip 20B on the upper surface of the die pad 11B is used as the semiconductor chip 20C on the undersurface of the die pad 11B, wires 14C cross and short because the disposition of the bonding pads is reversed right/left or up/down when seen from the upper side of the die pad 11B. In order to prevent this, a mirror chip, in which the disposition of the bonding pads and inner element circuitry are inverted (i.e., so that top and bottom face, or mirror, each other) to become rotationally symmetrical with respect to the semiconductor chip 20B on the upper surface of the lead frame 10B, is used for the semiconductor chip 20C on the undersurface of the lead frame 10B.

As shown in FIG. 16B, the mirror chip-structure semiconductor chip 20C is disposed with bonding pads 21C (right-side bonding pads 21C-11, 21C-12, . . . , and left-side bonding pads 21C-21, 21C-22, . . . ) near right and left edges thereof (since the semiconductor chip 20C is being viewed from its undersurface, left/right are opposite) in correspondence to the bonding pads 13B-11, 13B-12, . . . , 13B-21, 13B-22, . . . of the lead frame 10B. The right-side bonding pads 21C-11, 21C-12, . . . are connected to the left-side (when seen from the upper surface of the lead frame 10B) bonding pads 13B-11, 13B-12, . . . by the plural wires 14C. The left-side bonding pads 21C-21, 21C-22, . . . are connected to the right-side (when seen from the upper surface of the lead frame 10B) bonding pads 13B-21, 13B-22, . . .

The semiconductor chips 20B and 20C and the wires 14B and 14C are resin-sealed with the resin member 15B.

However, there have been the following problems (1) and (2) in the aforementioned conventional semiconductor devices and their methods of production.

(1) Problems in the Conventional Devices of FIGS. 14A to 15B

When the semiconductor chip 20A of FIGS. 14A and 14B is mounted in the package of FIGS. 15A and 15B, the positions at which the bonding pads of each are disposed become different and a short is generated due to the wires crossing. Thus, the bonding pads cannot be connected by the wires 14A. For this reason, it is necessary to newly create the semiconductor chip 20B of FIGS. 15A and 15B, which has the same function as that of the semiconductor chip 20A and in which the positions of the bonding pads are moved.

Thus, in the semiconductor devices of FIGS. 14A and 14B and FIGS. 15A and 15B, it is necessary to design and create a semiconductor chip for a certain package each time the configuration of that package changes. Moreover, enormous expenses and time to develop the created semiconductor chip become necessary because it is necessary to test the quality of the created semiconductor chip by blocking and the like (to verify operation). The size of the chip also becomes larger due to disposing the bonding pads of the semiconductor chip 20B to match the package of FIGS. 15A and 15B, or else it becomes necessary to maintain stocks relating to each of the semiconductor chips.

In order to eliminate such drawbacks, it is conceivable to dispose, as disclosed in Document 1, a metal wiring film on the semiconductor chip 20A of FIGS. 14A and 14B for converting the pad positions, and connect the bonding pads 21A of the semiconductor chip 20A of FIGS. 14A and 14B to the bonding pads 13B of the lead frame 10B of FIGS. 15A and 15B with wires through the metal wiring film. Alternatively, it is also conceivable to fix, as disclosed in Document 2, a signal position-converter having a wiring pattern, mount the semiconductor chip 20A of FIGS. 14A and 14B thereon, and connect the bonding pads 21A of the semiconductor chip 20A of FIGS. 14A and 14B to the bonding pads 13B of the lead frame 10A of FIGS. 15 and 15B with wires through the signal position-converter.

However, because a wiring structure for relay is not established in structures or methods in which the metal wiring film of Document 1 or the signal position-converter of Document 2 is disposed and bonding pads are wire-bonded, the wiring structure for relay is changed together with changes in the positions of the bonding pads of the semiconductor chip and the bonding pads of the lead frame. Therefore, there has been the potential for new peripheral devices to become necessary and for costs to increase exorbitantly when, for example, blocking or the like is conducted to test operation.

(2) Problems in the Conventional Device of FIGS. 16A to 16C

Because it is necessary to prepare two kinds of semiconductor chips (i.e., the upper-side semiconductor chip 20B and the under-side semiconductor chip 20C, which is a mirror chip of the semiconductor chip 20B), it is necessary to design and create two kinds of semiconductor chips for a certain package each time the configuration of that packages changes. Moreover, because it is necessary to test the quality of the created two kinds of semiconductor chips by blocking and the like (to verify operation), costs increase and the sizes of the chips become larger, or else it becomes necessary to maintain stocks relating to each of the semiconductor chips.

In order to eliminate such drawbacks, it is conceivable to use the metal wiring film for converting pad positions as disclosed in Document 1 or to use the signal position-converter having a wiring pattern as disclosed in Document 2. However, similar to (1) above, there has been the potential for new peripheral devices to become necessary and for costs to increase exorbitantly when, for example, blocking or the like is conducted to test operation.

SUMMARY OF THE INVENTION

It is an object of the present invention to provide a semiconductor device and a method of producing a semiconductor device that can eliminate the aforementioned problems in the prior art and in which disposal and replacement of bonding pads can be conducted easily and accurately.

In order to achieve the aforementioned object, a first aspect of the invention provides a semiconductor device comprising: a substrate including a first surface and a second surface; first bonding pads disposed outside the substrate near a periphery of the substrate; a semiconductor chip including an upper surface disposed with second bonding pads and an undersurface mounted on the substrate first surface; at least one relay chip including an upper surface disposed with third bonding pads, a first wiring pattern formed of wiring for connecting corresponding pad pairs of the third bonding pads, and an undersurface mounted on the upper surface of the semiconductor chip; and lead wires for electrically connecting the first bonding pads and the second bonding pads of the semiconductor chip, wherein one first bonding pad and one third bonding pad corresponding to the one first bonding pad are electrically connected via one lead wire, and another third bonding pad connected via one wiring to the one third bonding pad and a second bonding pad corresponding to the another third bonding pad are electrically connected via another lead wire.

Because the relay chip is superimposed on the semiconductor chip and the disposition of the pads is converted using the relay chip so that the pads can be connected to the first bonding pads, it is not necessary to alter the disposition of the bonding pads of the semiconductor chip and it is possible to wire-bond the pads to the first bonding pads of various modes of disposition. Moreover, because it is possible to structure the relay chip with only the bonding pads and the wiring pattern, it is possible to reduce developmental expenses or expenses necessary to redesign and test the operation of the semiconductor chip in comparison with the case in which a semiconductor chip is created in which the disposition of the pads has been altered. Additionally, because the relay chip is fixed to fit within an outer periphery of the semiconductor chip, it is possible to strongly fix the relay chip at a predetermined position, and it is possible to easily and accurately mount and wire-bond the relay chip without the relay chip deviating from a predetermined mounting position due to force applied thereto when the relay chip is mounted and wire-bonded. Also, the wiring pattern of the relay chip can be variously configured to correspond to the direction in which the disposition of the pads is converted. When drawbacks arise in this case, such as a short occurring between wires when the wires are complicated, the wiring pattern can be configured to a multi-layer interconnection structure.

When plural relay chips are used, the lengths of the wires can be shortened and reliability can be improved by disposing the relay chips near the periphery of the semiconductor chip. Moreover, because the size of each relay chip can be reduced, it is possible to reduce costs by reducing breakage and raising chip yield.

When plural relay chips are given the same structure, it is possible to reduce costs by reducing the kinds of chips used.

The semiconductor device according to the first aspect further comprises: a second semiconductor chip including an upper surface disposed with bonding pads and an undersurface mounted on the substrate second surface; and lead wires for electrically connecting the bonding wires with the first bonding pads.

Because the direction of the pads on one semiconductor chip is converted to the direction in which the pads are disposed on the other semiconductor chip using the first and second semiconductor chips that have the same structure, it is possible to easily produce a semiconductor device having a multi-chip package configuration without using the mirror chip that was conventionally necessary, and a reduction in cost due to the elimination of the mirror chip can be expected.

A second aspect of the invention provides a semiconductor device comprising: a substrate; first bonding pads disposed outside the substrate near a periphery of the substrate; plural semiconductor chips, each semiconductor chip including an upper surface disposed with second bonding pads and an undersurface mounted on a surface of the substrate; a relay chip including an upper surface disposed with third bonding pads, a wiring pattern formed of wiring for connecting corresponding pad pairs of the third bonding pads, and an undersurface mounted on the upper surfaces of the semiconductor chips; and lead wires for electrically connecting the first bonding pads and the second bonding pads of the semiconductor chip, wherein one first bonding pad and one third bonding pad corresponding to the one first bonding pad are electrically connected via one lead wire, and another third bonding pad connected via one wiring to the one third bonding pad and a second bonding pad corresponding to the another third bonding pad are electrically connected via another lead wire.

Because the relay chip is superimposed on the plural semiconductor chips and the disposition of the pads is converted by the relay chip, a multi-chip semiconductor device can be produced without constraints on the disposition of the pads. Moreover, because it is possible to structure the relay chip with only the bonding pads and the wiring pattern, it is possible to reduce developmental expenses or expenses necessary to redesign and test the operation of the semiconductor chip in comparison with the case in which a semiconductor chip is created in which the disposition of the pads has been altered. Additionally, because the relay chip is superimposed on the semiconductor chips, increases in area in the horizontal direction can be suppressed and the semiconductor device can be made compact. When the relay chip is fixed to fit within an outer periphery of an area formed by the semiconductor chips, it is possible to easily and accurately mount and wire-bond the relay chip.

In accordance with a third aspect of the invention, there is provided a method of producing a semiconductor, the method comprising the steps of: providing a substrate and first bonding pads disposed outside the substrate near a periphery of the substrate, and mounting a semiconductor chip that includes second bonding pads on the substrate; mounting at least one relay chip on the semiconductor chip, the at least one relay chip including third bonding pads and a wiring pattern formed of wiring for connecting corresponding pad pairs of the third bonding pads; electrically connecting the first bonding pads to the second bonding pads of the semiconductor chip using lead wires, so that one first bonding pad and one third bonding pad corresponding to the one first bonding pad are electrically connected via one lead wire, and another third bonding pad connected via one wiring to the one third bonding pad and a second bonding pad corresponding to the another third bonding pad are electrically connected via another lead wire; and sealing the substrate, the semiconductor chip, the at least one relay chip, and the lead wires with a resin member. Preferably, the wiring pattern includes a multi-layer interconnection structure comprising interlayer insulating films and conductive films that are alternatingly disposed. Further, preferably, the substrate is a die pad of a lead frame.

BRIEF DESCRIPTION OF THE DRAWINGS

FIG. 2 is a view showing an example of a method of producing the semiconductor device of FIGS. 1A to 1C;

FIG. 3 is a schematic enlarged sectional view showing an example of a multi-layer interconnection structure;

FIGS. 6A to 6C are schematic structural views of a semiconductor device according to a fourth embodiment of the invention;

FIGS. 8A to 8C are schematic structural views of a semiconductor device according to a fifth embodiment of the invention;

FIGS. 10A to 10C are schematic structural views of a semiconductor device according to a sixth embodiment of the invention;

FIGS. 11A and 11B are enlarged plan views of the semiconductor device of FIGS. 10A and 10B;

FIGS. 16A to 16C are schematic structural views of yet another conventional semiconductor device.

DETAILED DESCRIPTION OF THE PREFERRED EMBODIMENTS

First Embodiment (Structure)

Figure 1A:
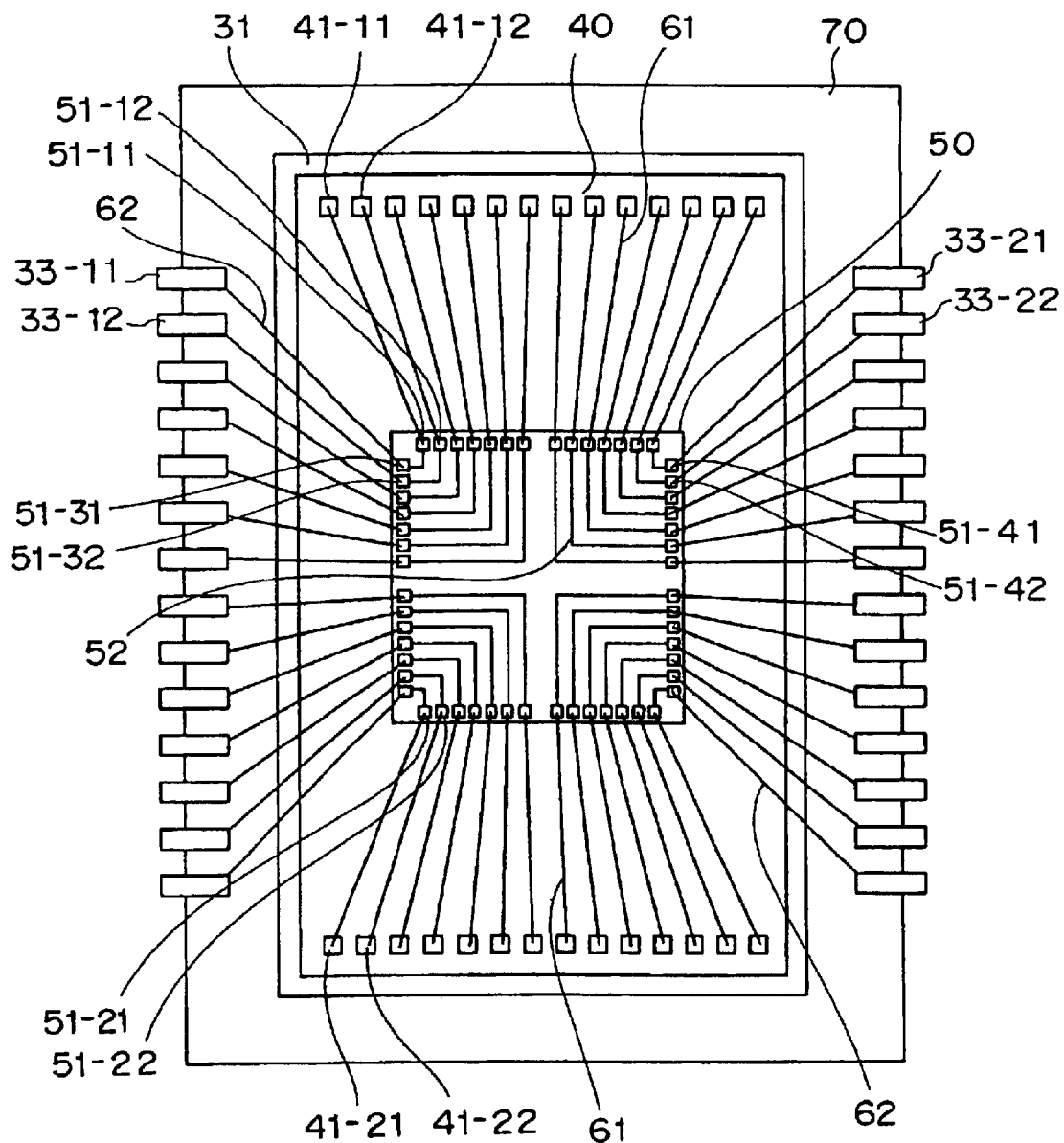
FIGS. 1A to 1C are schematic structural views of a semiconductor device according to a first embodiment of the invention.
Figure 1B:
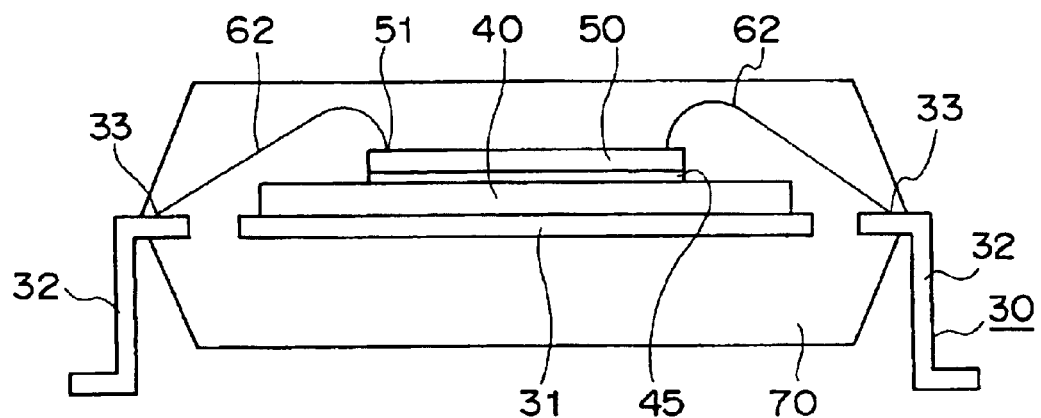
Figure 1C:
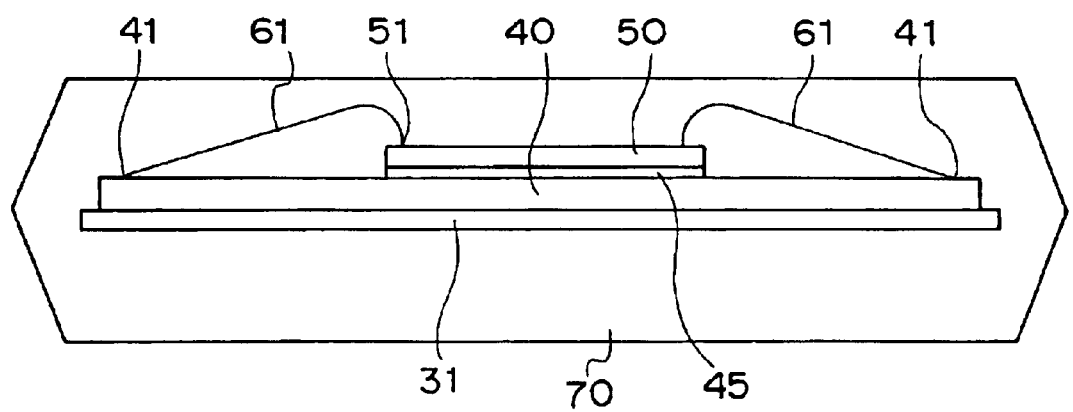

FIGS. 1A to 1C are schematic structural views of a SOP semiconductor device according to a first embodiment of the invention. FIG. 1A is an abbreviated plan view of the semiconductor device. FIG. 1B is a sectional view in which FIG. 1A has been cut horizontally. FIG. 1C is a sectional view in which FIG. 1A has been cut vertically.

In this SOP semiconductor device, a lead frame 30 is used as a substrate for mounting a semiconductor chip. As shown in FIG. 1A, the lead frame 30 includes a die pad 31, which is substantially rectangular in plan view, for mounting a semiconductor chip. Plural leads 32 are horizontally disposed a predetermined distance away from left and right edges of the die pad 31. The leads 32 include inner lead portions disposed with first bonding pads 33 (left-side bonding pads 33-11, 33-12, . . . , and right-side bonding pads 33-21, 33-22, . . . ) and outer lead portions that are horizontally pulled out.

A semiconductor chip 40, which is substantially rectangular when seen in plan view, is fixed on an upper surface of the die pad 31. The semiconductor chip 40 includes a substrate (e.g., comprising silicon) disposed with a semiconductor memory, an integrated semiconductor circuit (referred to below as an "IC"), and the like. Second bonding pads 41 (upper-side bonding pads 41-11, 41-12, . . . , and lower-side bonding pads 41-21, 41-22, . . . ) are disposed near upper and lower edges of an upper surface of the semiconductor chip 40.

A relay chip 50, which is substantially square in plan view, is fixed with an insulating binding material 45 to fit within an outer periphery of the upper surface of the semiconductor chip 40. The relay chip 50 includes a thin substrate comprising silicon, glass epoxy resin, or the like. Third bonding pads 51 (upper-side bonding pads 51-11, 51-12, . . . , lower-side bonding pads 51-21, 51-22, . . . , left-side bonding pads 51-31, 51-32, . . . , and right-side bonding pads 51-41, 51-42, . . . ) are disposed near four edges of an upper surface of the relay chip 50 substrate.

A wiring pattern 52 comprising a conductive film and the like is formed on the substrate of the relay chip 50, and the bonding pads 51 are interconnected by the wiring pattern 52. For example, the left half of the upper-side bonding pads 51-11, 51-12, . . . is interconnected with the upper half of the left-side bonding pads 51-31, 51-32, . . . , the right half of the upper-side bonding pads 51-11, 51-12, . . . is interconnected with the upper half of the right-side bonding pads 51-41, 51-42, . . . , the left half of the lower-side bonding pads 51-21, 51-22, . . . is interconnected with the lower half of the left-side bonding pads 51-31, 51-32, . . . , and the right half of the lower-side bonding pads 51-21, 51-22, . . . is connected to the lower half of the right-side bonding pads 51-41, 51-42, . . .

The bonding pads 41 of the semiconductor chip 40 are connected to the bonding pads 51 of the relay chip 50 by plural wires 61. Other bonding pads 51 that are connected to these bonding pads 51 via the wiring pattern 52 are connected to the bonding pads 33 of the lead frame 30 by wires 62.

For example, the left half of the upper-side bonding pads 41-11, 41-12, . . . of the semiconductor 40 is connected to the upper half of the left-side bonding pads 33-11, 33-12, . . . of the lead frame 30 via the wires 61 and the relay chip 50, and the right half of the upper side bonding pads 41-11, 41-12, . . . of the semiconductor chip 40 is connected to the upper half of the right-side bonding pads 33-21, 33-22, . . . of the lead frame 30 via the wires 61 and the relay chip 50. Similarly, the left half of the lower-side bonding pads 41-21, 41-22, . . . of the semiconductor chip 40 is connected to the lower half of the left-side bonding pads 33-11, 33-12, . . . of the lead frame 30, and the right half of the lower-side bonding pads 41-21, 41-22, . . . of the semiconductor chip 40 is connected to the lower half of the right-side bonding pads 33-21, 33-22, . . . of the lead frame 30.

The die pad 31, the semiconductor chip 40, the relay chip 50, the wires 61 and 62, and the bonding pads 33 of the lead frame 30 are resin-sealed with a resin member 70. The outer lead portions of the leads 32 project out from the resin member 70 and are bent downward in a substantial L-shape.

(Method of Production)

FIG. 2 is a view showing an example of a method of producing the semiconductor device of FIGS. 1A to 1C.

The semiconductor device of FIGS. 1A to 1C is produced by a method comprising, for example, (1) a chip-bonding step, (2) a mounting step, (3) a wire-bonding step, and (4) a sealing step. Each of these production steps will be described below.

(1) Chip-Bonding Step

The semiconductor chip 40 is held by a dice bonder, and an undersurface of the semiconductor chip 40 is fixed to the upper surface of the die pad 31 of the lead frame 30 with a binding material such as silver paste.

(2) Mounting Step

The insulating binding material 45 is applied to a substantially central area of the upper surface of the semiconductor chip 40 or to the undersurface of the relay chip 50. Examples of the binding material 45 include low-stress paste material that uses epoxy resin or the like and film material, such as thermoplastic resin and thermosetting resin. The relay chip 50 is held by a dice bonder, and the undersurface of the relay chip 50 is fixed with the binding material 45 to fit within the outer periphery of the upper surface of the semiconductor chip 40.

It is preferable during this fixing to minimize impact force on the semiconductor chip 40 by adjusting contact pressure and lift rate of the dice bonder. In order to buffer impact force, a material having an impact-buffering function may be used as the binding material 45, or an impact-buffering pad may be separately disposed between the semiconductor chip 40 and the relay chip 50.

(3) Wire-Bonding Step

Using a dice bonder, the bonding pads 41 of the semiconductor chip 40 are connected to the bonding pads 51 of the relay chip 50 with the wires 61, and the bonding pads 51 of the relay chip 50 are connected to the bonding pads 33 of the lead frame 30 with the wires 62.

(4) Sealing Step

The lead frame 30 mounted with the semiconductor chip 40 and the relay chip 50 is set in, for example, a die mold, and molded by the resin member 70 comprising epoxy resin or the like so that the semiconductor chip 40, the relay chip 50, and the wires 61 and 62 are resin-sealed.

Excessive resin, flash, and unwanted portions of the lead frame 30 are removed. When the outer lead portions of the leads 32 are bent to a desired shape, production of the semiconductor device of FIGS. 1A to 1C is finished. Thereafter, quality is tested as needed with a tester.

(Operation)

Because the outer lead portions of the leads 32 and the semiconductor chip 40 are electrically connected via the relay chip 50 and the wires 61 and 62 in the semiconductor device of FIGS. 1A to 1C, predetermined electrical operation can be carried out when a signal is inputted/outputted to the outer lead portions.

(Effects)

In the first embodiment, there are the following effects (a) to (g).

(a) The relay chip 50 is superimposed on the semiconductor chip 40, and the disposition of the pads is converted to substantial right angles using the relay chip 50 so that the pads can be connected to the bonding pads 33 of the lead frame 30. Therefore, it becomes possible to mount a semiconductor chip on the package of FIGS. 15A and 15B without creating the conventional semiconductor chip 20B of FIGS. 15A and 15B.

Figure 15A:
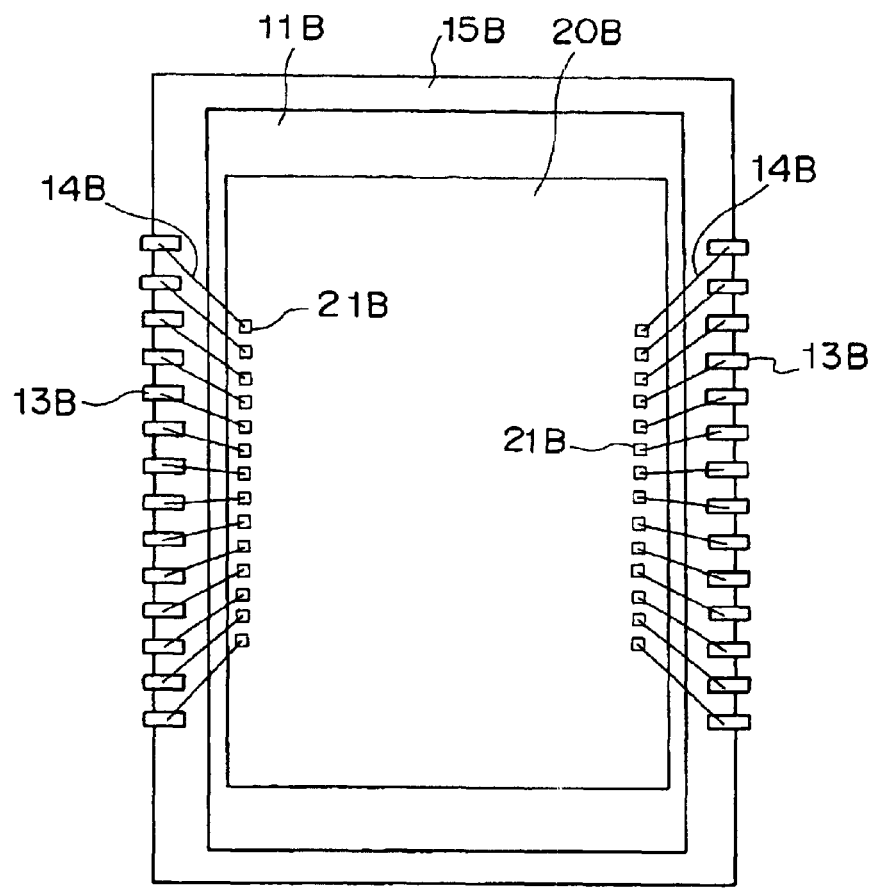
FIGS. 15A and 15B are schematic structural views of another conventional semiconductor device.
Figure 15B:
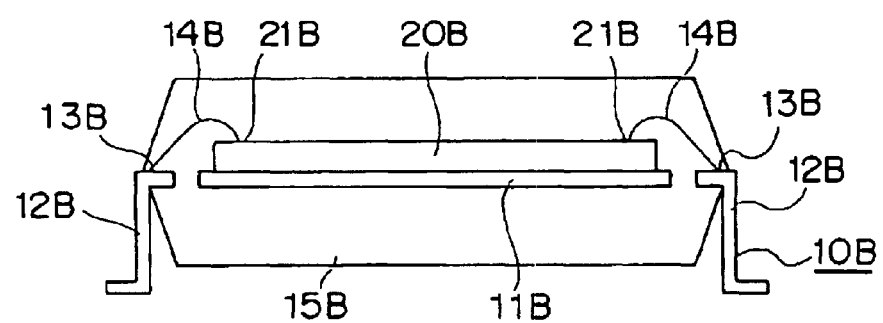
Figure 16B:
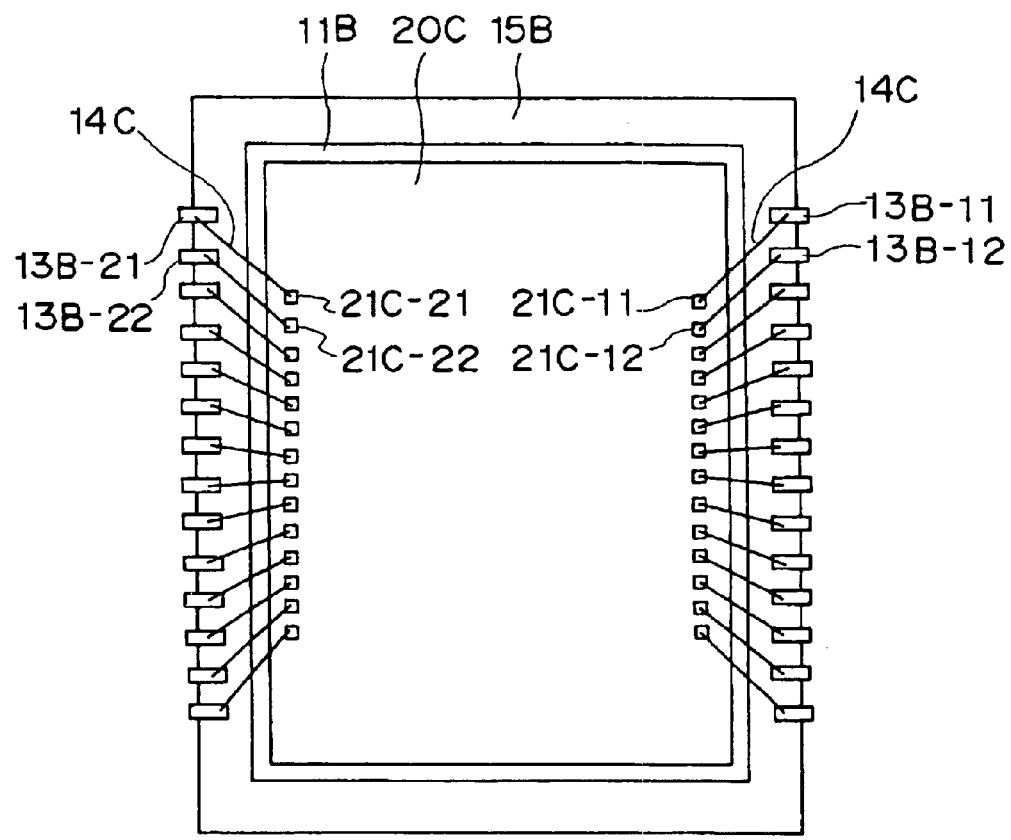
Figure 16C:
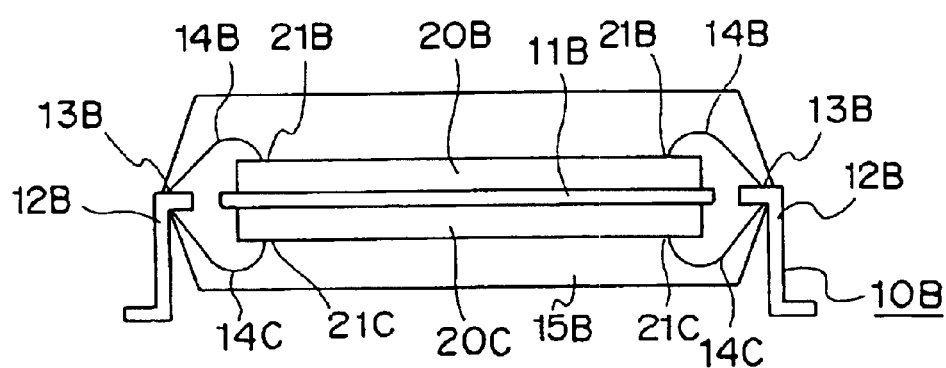

(b) Because it is possible to structure the relay chip 50 with only the bonding pads 51 and the wiring pattern 52, it is possible to reduce developmental expenses or expenses necessary to redesign and test the operation of a semiconductor chip in comparison with the case in which the conventional semiconductor chip 20B of FIGS. 15A and 15B is created.

(c) Because the relay chip 50 is superimposed on the semiconductor chip 40 without the size of the chip becoming larger due to disposing the pads to match the conventional semiconductor chip 20B of FIGS. 15A and 15B, the area necessary to dispose the relay chip 50 does not increase.

(d) Because the relay chip 50 is fixed to fit within the outer periphery of the upper surface of the semiconductor chip 40, it is possible to strongly fix the relay chip 50 at a predetermined position. Therefore, it is possible to easily and accurately mount and wire-bond the relay chip 50 without the relay chip 50 deviating from the predetermined mounting position due to force applied thereto when the relay chip 50 is mounted and wire-bonded.

(e) When a material having an impact-buffering function is used as the binding material 45, or when an impact-buffering pad is separately disposed between the semiconductor chip 40 and the relay chip 50, it is possible to minimize impact force on the semiconductor chip 40 and to thereby reduce failure rate of the semiconductor chip 40 when the relay chip 50 is fixed.

(f) The wiring pattern 52 of the relay chip 50 can be variously configured to correspond to the direction in which the disposition of the pads is converted. When drawbacks arise in this case, such as a short occurring between wires when the wiring is complicated, the wiring pattern 52 can be configured to a multi-layer interconnection structure like the one shown in FIG. 3.

(g) FIG. 3 is a schematic enlarged sectional view showing an example of a multi-layer interconnection structure.

The relay chip 50 includes a thin substrate 50*a* comprising silicon, glass epoxy resin, or the like. A conductive film 50*b* that forms the wiring pattern 52 and an interlayer insulating film 50*c* are alternatingly disposed and formed in a superimposed manner on the substrate 50*a*. The conductive film 50*b* is connected to the bonding pads 51 through a contact hole 50*d* or the like. When such a superimposed structure is employed, it is possible to easily form a complex wiring pattern 52 without causing a short between the wires.

Second Embodiment (Structure)

Figure 4:
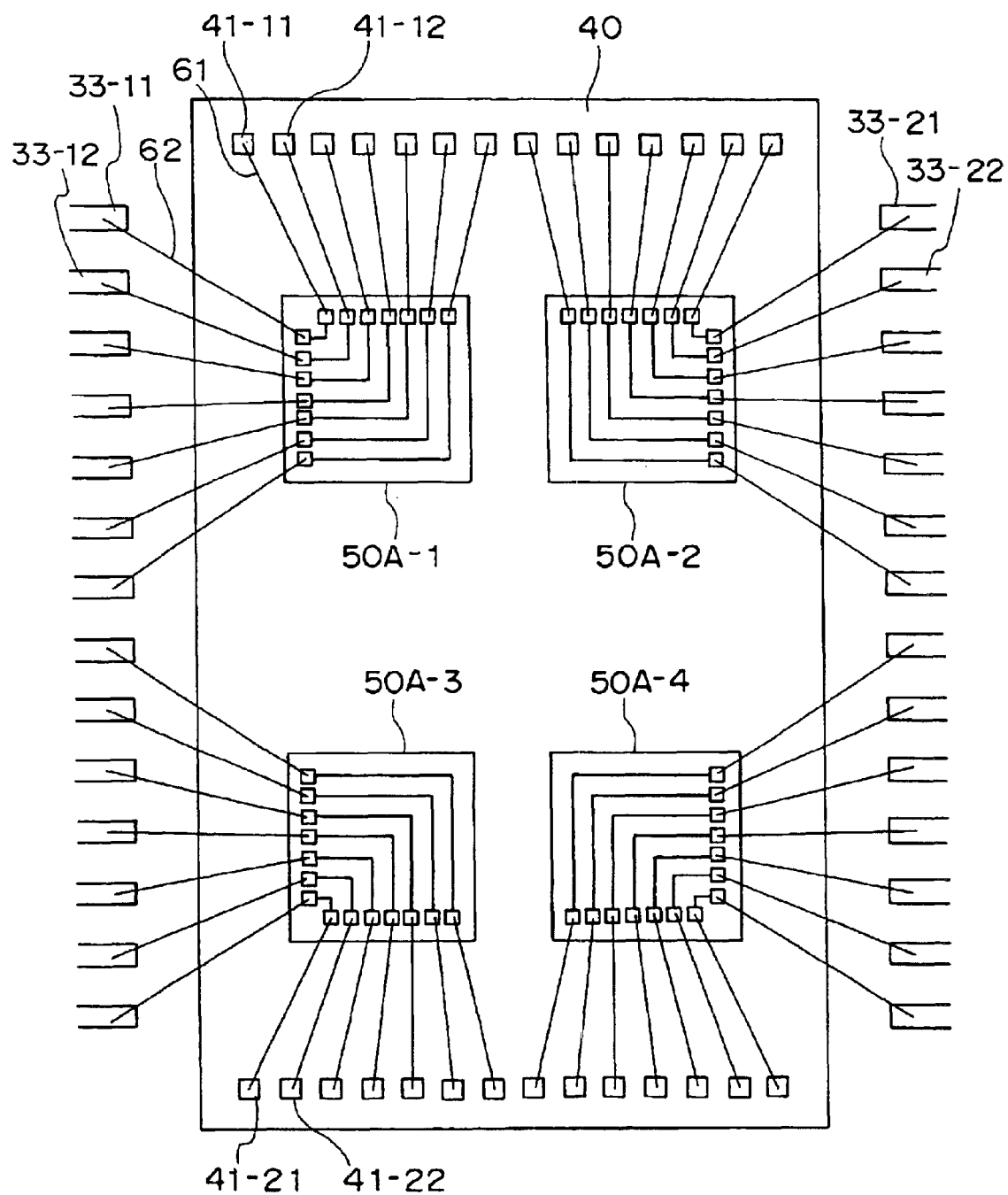
FIG. 4 is an abbreviated schematic plan view of a semiconductor device according to a second embodiment of the invention.

FIG. 4 is an abbreviated schematic plan view of a SOP semiconductor device according to a second embodiment of the invention. Elements in common with elements in FIGS. 1A to 3, which illustrate the first embodiment, are designated by common reference numerals.

In this SOP semiconductor device, plural (e.g., four, resulting from the relay chip 50 being horizontally divided into two and vertically divided into two) relay chips 50A-1, 50A-2, 50A-3, and 50A-4, which each have a substantial square shape, are used in place of the relay chip 50 of FIGS. 1A to 1C. The relay chips 50A-1 to 50A-4 are fixed to set within the outer periphery of the upper surface of the same semiconductor chip 40 of FIGS. 1A to 1C.

Each of the relay chips 50A-1 to 50A-4 has the same structure and is disposed with plural bonding pads 51 near two adjacent edges thereof. The plural bonding pads 51 at the edges are interconnected by the wiring pattern 52. In order to shorten the lengths of the wires 61 and 62 for the bonding pads, the positions of the bonding pads 51 are rotated to face the bonding pads 33 and 41, the relay chips 50A-1 to 50A-4 are disposed near the four corners of the upper surface of the semiconductor chip 40, and, substantially identical to FIGS. 1A to 1C, the bonding pads 51 of the relay chips 50A-1 to 50A-4 are connected to the bonding pads 41 of the semiconductor chip 40 and to the bonding pads 33 of the lead frame 30 by the wires 61 and 62.

Other structures and operations are substantially identical to those of FIGS. 1A to 1C.

(Method of Production)

The relay chips 50A-1 to 50A-4 can be produced by, for example, horizontally dividing the relay chip 50 of FIGS. 1A to 1C into two and vertically dividing the relay chip 50 into two.

The semiconductor chip 40 is fixed on the die pad 31 in a chip-bonding step in a manner substantially similar to the production method of FIG. 2. The relay chips 50A-1 to 50A-4 are rotated to align the bonding pads 51 in the relay chips 50A-1 to 50A-4 and then fixed on the semiconductor chip 40 with the binding material 45 in a mounting step. Next, the relay chips 50A-1 to 50A-4 are connected to the bonding pads 41 of the semiconductor chip 40 and to the bonding pads 33 of the lead frame 30 with the wires 61 and 62 in a wire-bonding step.

Thereafter, the semiconductor chip 40, the relay chips 50A-1 to 50A-4, and the wires 61 and 62 are resin-sealed with the resin member 70 in a sealing step, and production of the semiconductor device of FIG. 4 is finished when processes substantially similar to those of FIG. 2 are conducted.

(Effects)

In the second embodiment, because the plural relay chips 50A-1 to 50A-4 are used in place of the single relay chip 50 of the first embodiment and the disposition of the pads is converted to substantial right angles, the second embodiment has substantially the same effects as effects (a) to (g) of the first embodiment. There are also the following effects (h) to (j).

(h) Because the relay chips 50A-1 to 50A-4 are disposed near the four corners of the upper surface of the semiconductor chip 40, it is possible to shorten the length of the wires 61 and 62 in comparison with the first embodiment.

(i) Because the sizes of the relay chips 50A-1 to 50A-4 are small in comparison to the relay chip 50 of the first embodiment, it is possible to raise chip yield by reducing wire breakage of the wiring pattern 52 during production, whereby it becomes possible to lower the cost of the relay chips 50A-1 to 50A-4.

(j) Although the four relay chips 50A-1 to 50A-4 are used, any other number of relay chips (e.g., 2, 3, 5, etc.) may be used to correspond to the mode in which the bonding pads 33 and 41 are disposed.

Third Embodiment (Structure)

Figure 5A:
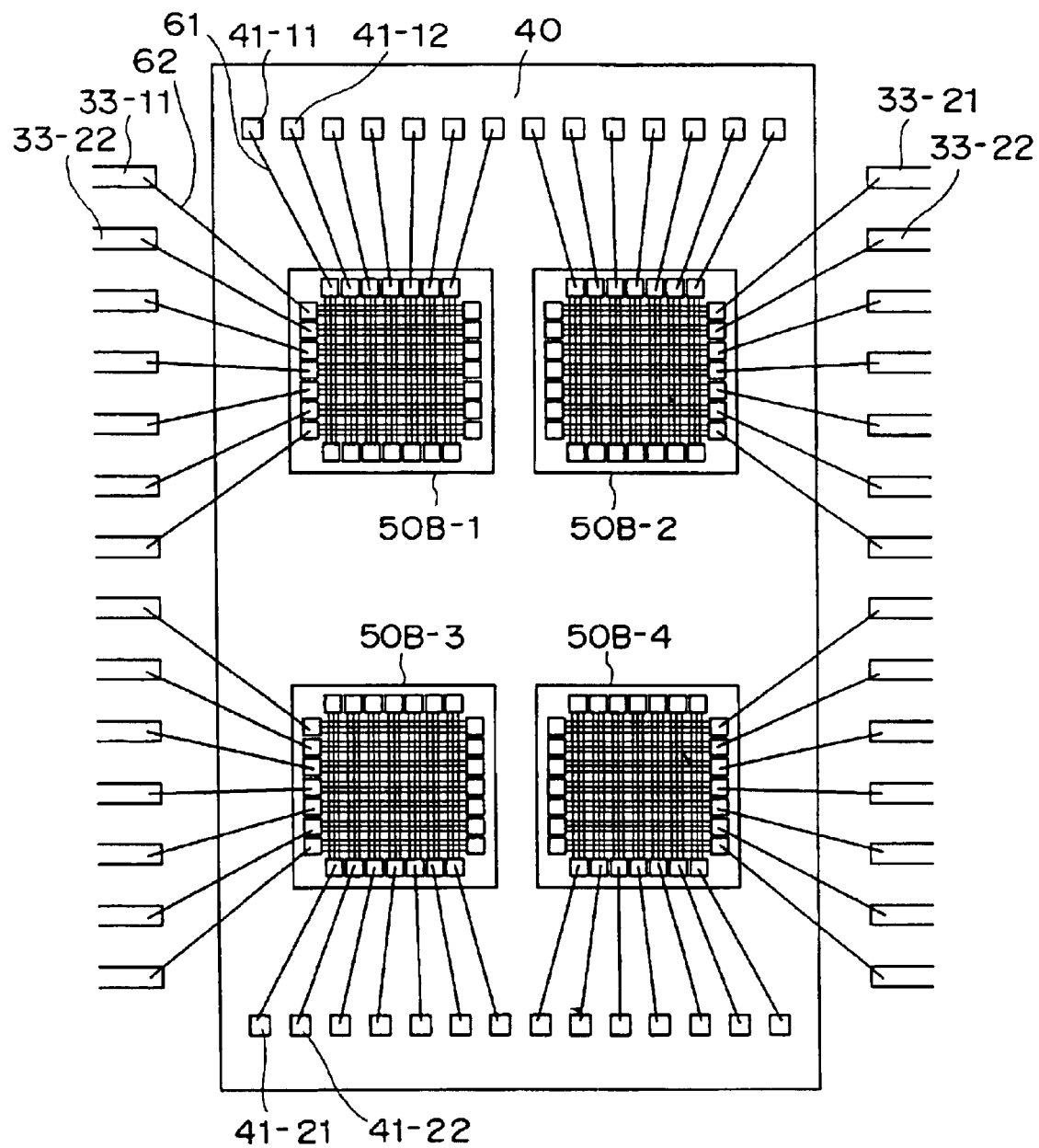
FIGS. 5A and 5B are schematic structural views of a semiconductor device according to a third embodiment of the invention.
Figure 5B:
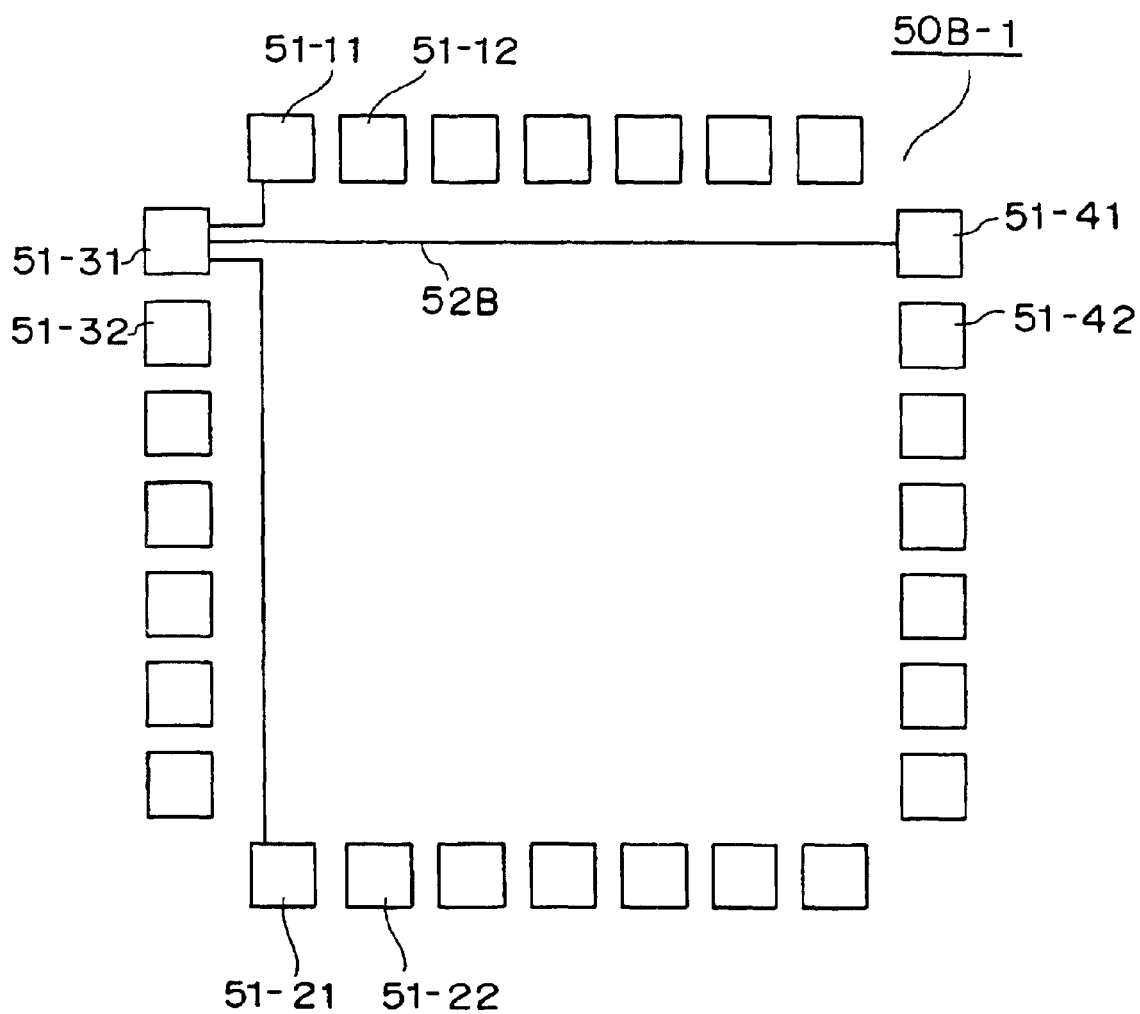

FIGS. 5A and 5B are schematic structural views of a SOP semiconductor device according to a third embodiment of the invention. FIG. 5A is an abbreviated plan view, and FIG. 5B is an enlarged view of a wiring pattern of a relay chip within FIG. 5A. In these drawings, elements in common with elements in FIGS. 1A to 4, which illustrate the first and second embodiments, are designated by common reference numerals.

In this SOP semiconductor device, in place of the four relay chips 50A-1, 50A-2, 50A-3, and 50A-4 of FIG. 4, four substantially square relay chips 50B-1, 50B-2, 50B-3, and 50B-4 are fixed by the resin member 45 near four corners to fit within the bonding pads 41 on the upper surface of the semiconductor chip 40. The relay chips 50B-1 to 50B-4 have the same structure, and a schematic plan view of the relay chip 50B-1 is shown in FIG. 5B.

The relay chip 50B-1 has a multi-layer interconnection structure like the one shown in FIG. 3, and comprises the thin substrate 50a having disposed thereon a wiring pattern 50B of a multi-layer interconnection structure formed of the conductive film 50b and the interlayer insulating film 50c, with the third bonding pads 51 being formed thereon. Each of the bonding pads 51 is connected to the wiring pattern 52B through the contact hole 50d.

The plural bonding pads 51 are disposed near four edges of an upper surface of the relay chip 50B-1 (upper-side bonding pads 51-11, 51-12, . . . , lower-side bonding pads 51-21, 51-22, . . . , left-side bonding pads 51-31, 51-32, . . . , and right-side bonding pads 51-41, 51-42, . . . ). Bonding pads at one edge (e.g., the left-side bonding pad 51-31) are connected to bonding pads at the other three edges (e.g., the upper-side bonding pad 51-11, the lower-side bonding pad 51-21, and the right-side bonding pad 51-41) by the conductive film 50b of the wiring pattern 52B.

Thus, it is possible for the four relay chips 50B-1 to 50B-4 of FIG. 5A to have the same functions as those of the relay chips 50A-1 to 50A-4 of FIG. 4, even if they face the same direction. The relay chips 50B-1 to 50B-4 are, similar to the relay chip 50 of FIGS. 1A to 1C, connected to the bonding pads 41 of the semiconductor chip 40 and to the bonding pads 33 of the lead frame 30 by the wires 61 and 62.

Other structures and operations are substantially the same as those of FIGS. 1A to 1C and FIG. 4.

(Method of Production)

Using the four relay chips 50B-1 to 50B-4, the semiconductor device of the third embodiment is produced in the same manner as the semiconductor device of the second embodiment.

(Effects)

In the third embodiment, because the disposition of the pads is converted to substantial right angles using the relay chips 50B-1 to 50B-4, the third embodiment has substantially the same effects as effects (a) to (j) of the first and second embodiments. There are also the following effects (k) and (l).

(k) Whereas in FIG. 4 of the second embodiment it was necessary to rotate and mount the relay chips 50A-1 to 50A-4, it is not necessary in FIGS. 5A and 5B of the present embodiment to rotate the relay chips 50B-1 to 50B-4. Thus, the mounting step becomes easy.

(l) Because the direction in which it is possible to convert the disposition of the pads becomes 360°, the degree of freedom of the wire-bonding direction becomes even greater, and it becomes possible to accommodate packages having various pad dispositions.

Fourth Embodiment (Structure)

Figure 6B:
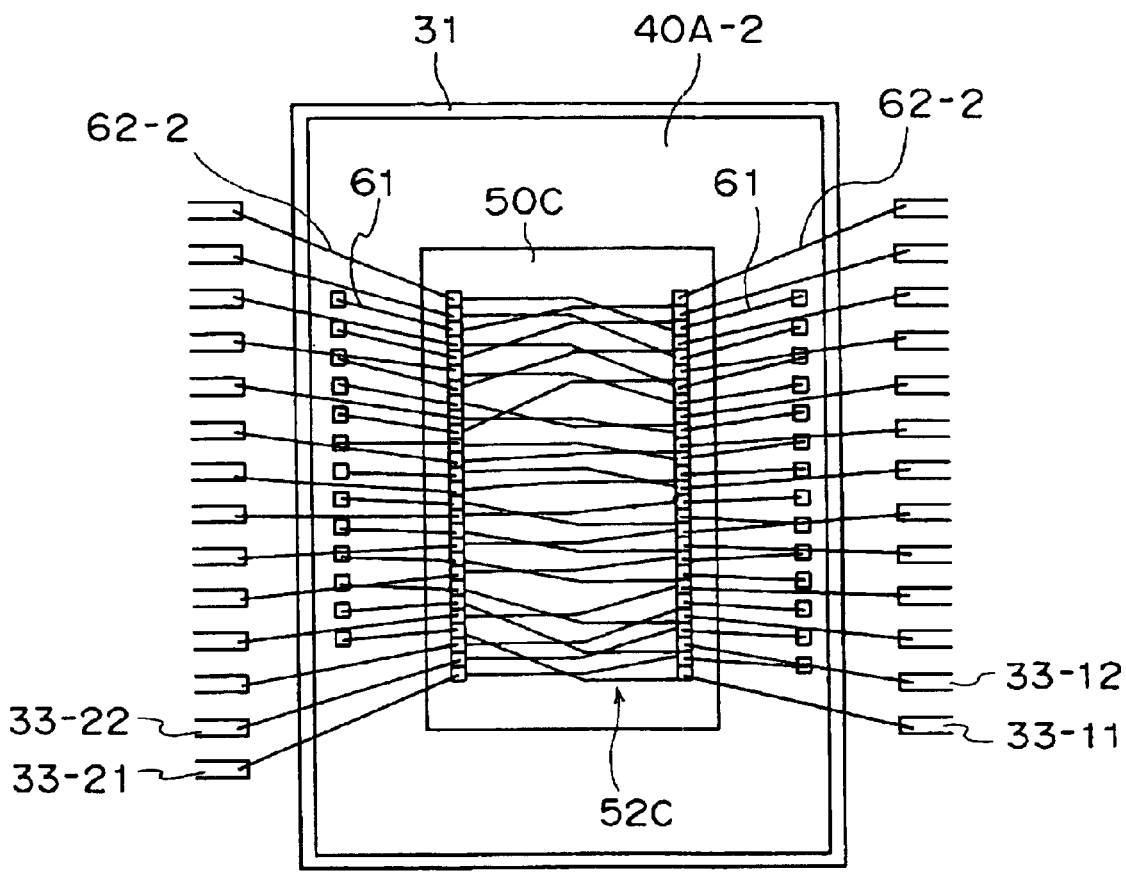
Figure 6C:
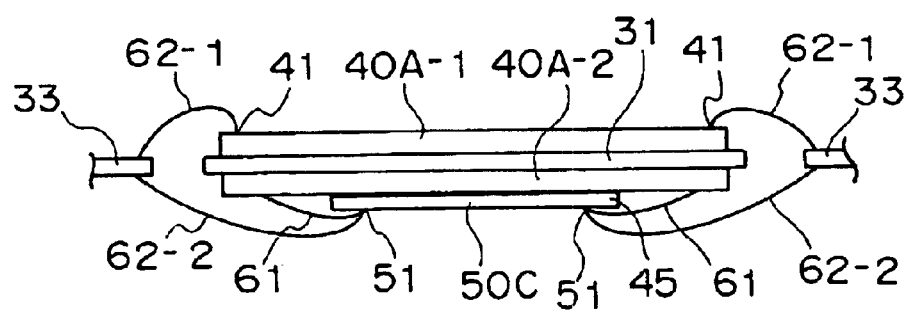
Figure 7:
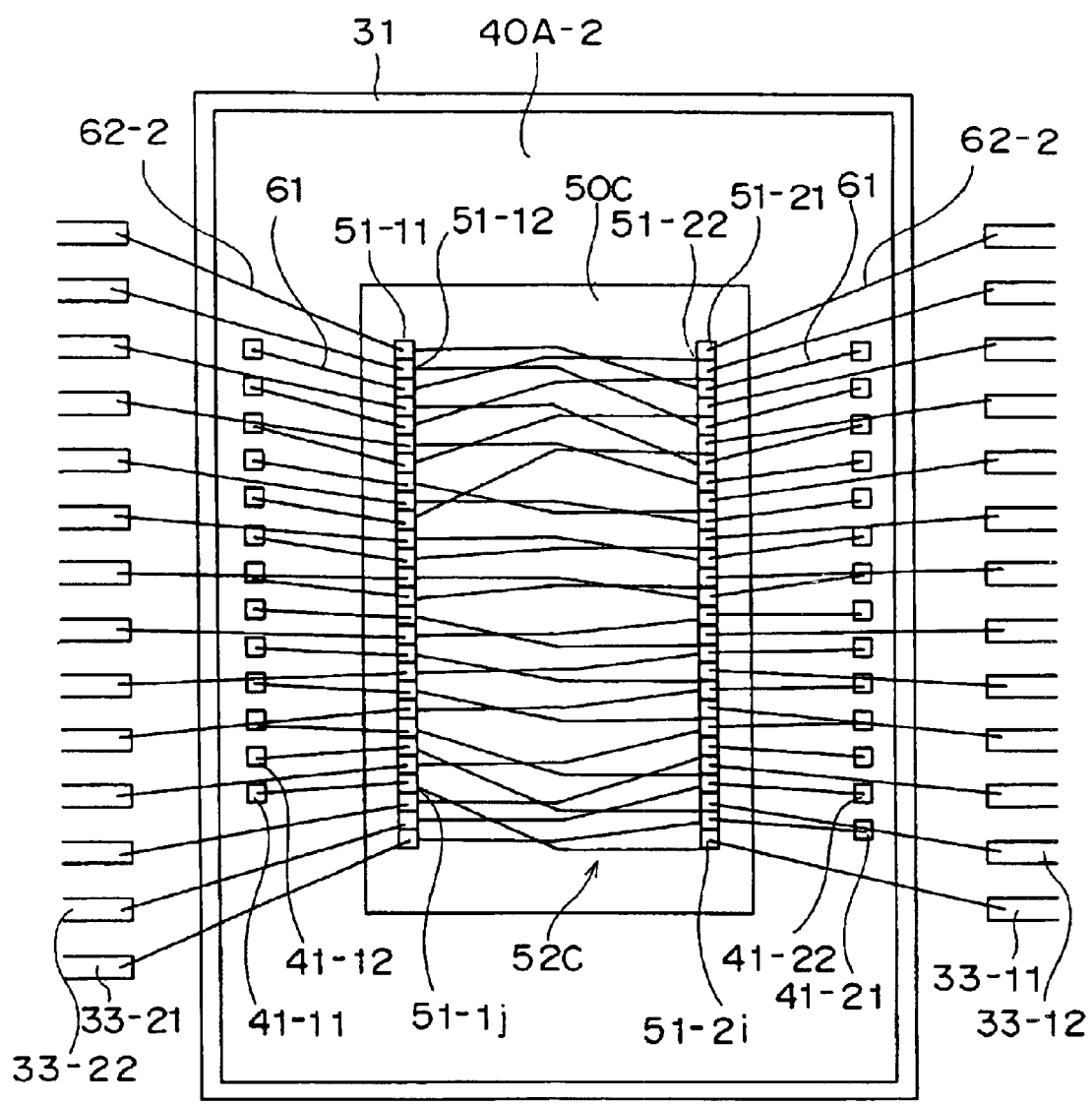
FIG. 7 is an enlarged plan view of the semiconductor device of FIG. 6B.

FIGS. 6A to 6C are schematic structural views of a semiconductor device having a multi-chip package configuration according to a fourth embodiment of the invention. FIG. 6A is an abbreviated plan view seen from an upper surface, FIG. 6B is an abbreviated bottom view seen from an undersurface, and FIG. 6C is an abbreviated longitudinal sectional view. FIG. 7 is an enlarged plan view of he semiconductor device of FIG. 6B. In these drawings, elements in common with elements in FIGS. 1A to 5B, which illustrate the first through third embodiments, are designated by common reference numerals.

In this semiconductor device having the multi-chip package configuration, semiconductor chips 40A-1 and 40A-2, which are substantially rectangular in plan view and have the same structure, are respectively fixed to the upper surface and the undersurface of the die pad 31 using the lead frame 30 of FIGS. 1A to 1C. A relay chip 50C, which is substantially rectangular in plan view, is fixed with the binding material 45 to fit within an outer periphery of an upper surface of one (e.g., the semiconductor chip 40A-2 disposed on the undersurface of the die pad 31) of the semiconductor chips 40A-1 and 40A-2.

Second bonding pads 41 (when seen from the upper surface, left-side bonding pads 41-11, 41-12, . . . , and right-side bonding pads 41-21, 41-22, . . . ) are disposed near left and right edges of upper surfaces of the semiconductor chips 40A-1 and 40A-2.

The relay chip 50C fixed in a substantial center of the semiconductor chip 40A-2 at the undersurface of the die pad 31 has a multi-layer interconnection structure such as the one shown in FIG. 3, and third bonding pads 51 (left-side bonding pads 51-11, 51-12, . . . , 51-1J, . . . , and right-side bonding pads 51-21, 51-22, . . . , 51-2i) are disposed near left and right edges of an upper surface of the relay chip 50C. The left-side bonding pads 51-11, 51-12, . . . , 51-1J, . . . and the right-side bonding pads 51-21, 51-22, . . . , 51-2i are interconnected by the wiring pattern 52C having the multi-layer interconnection structure so that the wiring is reversed upwards, downwards, rightwards, and leftwards.

The bonding pads 51 are connected to the bonding pads 41 of the semiconductor chip 40A-2 by the wires 61 and connected to the bonding pads 33 of the lead frame 30 by wires 62-1 and 62-2.

For example, the bonding pad 33-11 of the lead frame 30 is connected to the bonding pad 41-11 of the semiconductor chip 40A-1 on the upper surface of the die pad 31 by the wire 62-1 and connected to the bonding pad 51-2i of the relay chip 50 on the undersurface of the die pad 31 by the wire 62-2. The bonding pad 51-2i is connected to the opposite bonding pad 51-1i by the wiring pattern 52C, and the bonding pad 51-1j is connected to the bonding pad 41-11 of the semiconductor chip 40A-2 on the undersurface of the die pad 31 by the wire 61. Thus, the bonding pad 33-11 of the lead frame 30 is connected to the bonding pad 41-11 of the semiconductor chip 40A-1 on the upper surface of the die pad 31 and to the bonding pad 41-11 of the semiconductor chip 40A-2 on the undersurface of the die pad 31.

The semiconductor chips 40A-1 and 40A-2, the relay chip 50C, and the wires 61, 62-1 and 62-2 are resin-sealed with the resin member 70 in the same manner as in FIGS. 1A to 1C. Other structures and operations are substantially the same as those of FIGS. 1A to 1C.

(Method of Production)

The semiconductor chip 40A-1 is fixed to the upper surface of the die pad 31, and the semiconductor chip 40A-2, which has the same structure as that of the semiconductor chip 40A-1, is fixed to the undersurface of the die pad 31 in a chip-mounting step in a manner substantially the same as that of FIGS. 1A to 1C. The relay chip 50C is fixed by the binding material 45 in a mounting step to fit within the outer periphery of the upper surface of the semiconductor chip 40A-2. Next, the bonding pads 41 of the semiconductor chip 40A-1 on the upper surface of the die pad 31 are connected to the bonding pads 33 of the lead frame 30 by the wires 62-1 in a wire-bonding step.

The bonding pads 51 of the relay chip 50C are connected to the bonding pads 41 of the semiconductor chip 40A-2 on the undersurface of the die pad 31 by the wires 61 and connected to the bonding pads 33 of the lead frame 30 by the wires 62-2. Thereafter, the semiconductor chips 40A-1 and 40A-2, the relay chip 50C, and the wires 61, 62-1 and 62-2 are resin-sealed with the resin member 70, and production of the semiconductor device of FIGS. 6A to 6C is finished when processes substantially the same as those of FIGS. 1A to 1C are conducted.

(Effects)

In the fourth embodiment, there are effects that are substantially the same as effects (b) to (e) of the first embodiment. There are also the following effects (1) to (3).

(1) Because the direction in which the pads are disposed on the semiconductor chip 40A-2 are converted to the direction in which the pads are disposed on the semiconductor chip 40A-1 by the relay chip 50C using the two semiconductor chips 40A-1 and 40A-2 that have the same structure, it is possible to easily produce a semiconductor device having a multi-chip package configuration without using the mirror chip that was conventionally necessary. Thus, periods of time that were conventionally necessary for creating and developing the mirror chip can be cut, and there is no need to keep an extra stock of mirror chips as was conventionally the case.

(2) The same action and effects as those in the fourth embodiment can be obtained even if the relay chip 50C is fixed on the semiconductor chip 40A-1 on the upper surface rather than on the undersurface.

(3) The wiring pattern 52C of the relay chip 50C can be variously configured to correspond to directions in which the disposition of the pads is converted.

Fifth Embodiment (Structure)

Figure 8A:
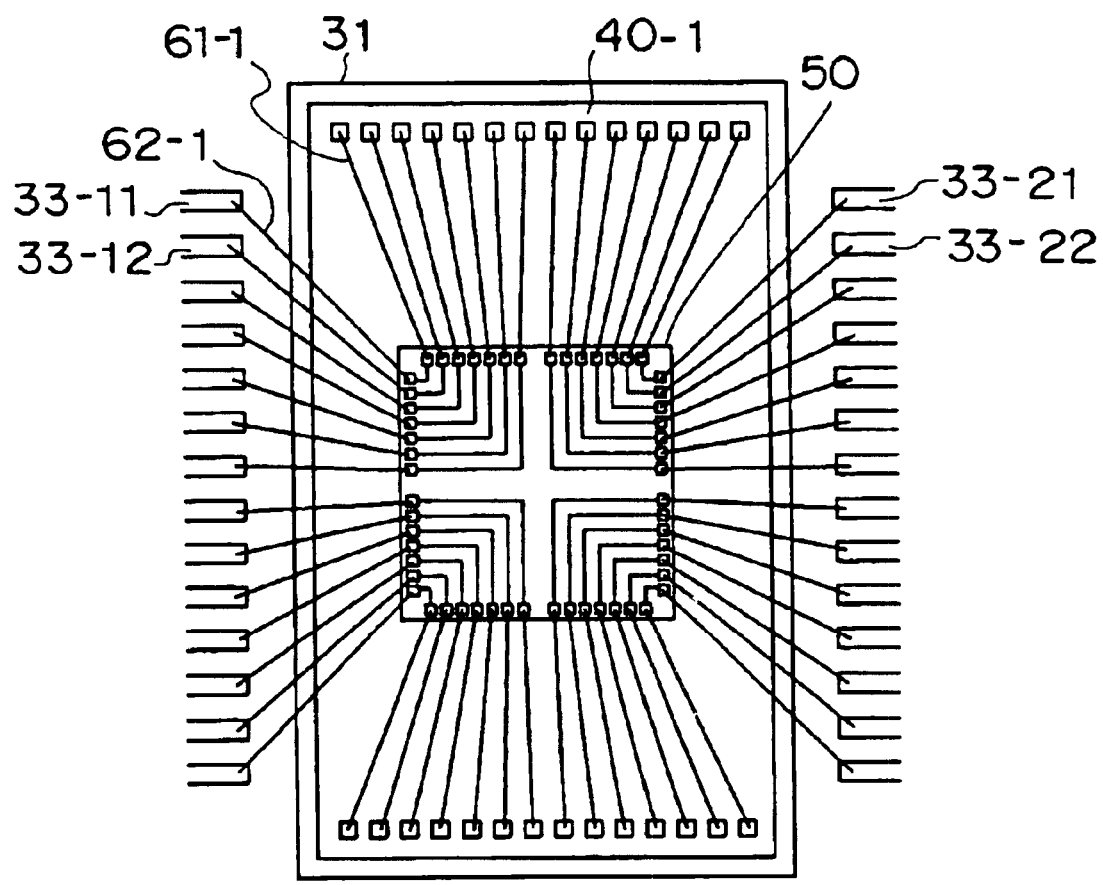
Figure 9A:
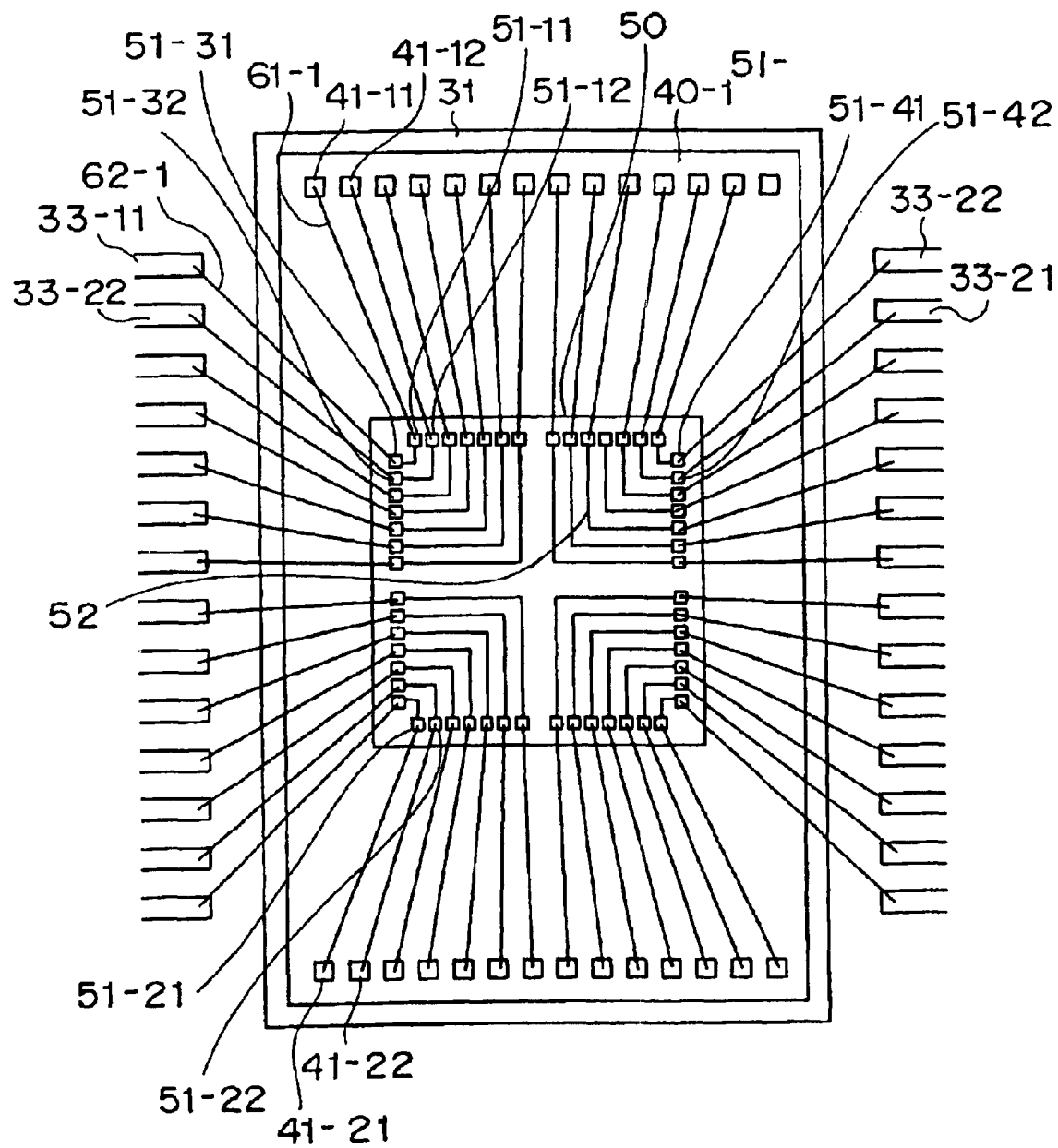
FIGS. 9A and 9B are enlarged plan views of the semiconductor device of FIGS. 8A and 8B.
Figure 9B:
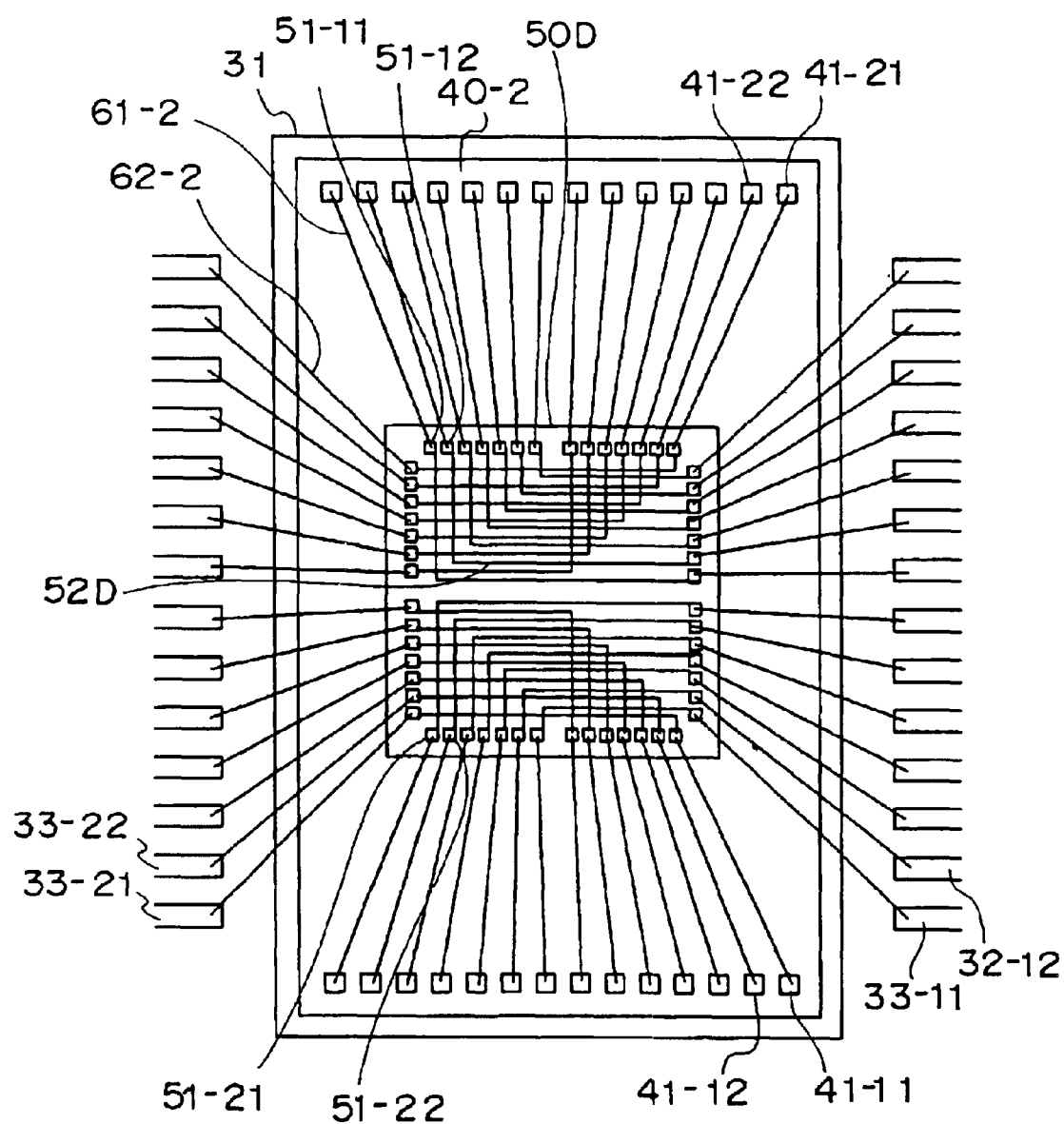

FIGS. 8A to 8C are schematic structural views of a semiconductor device having a multi-chip package configuration according to a fifth embodiment of the invention. FIG. 8A is an abbreviated plan view seen from an upper surface. FIG. 8B is an abbreviated bottom view seen from an undersurface. FIG. 8C is an abbreviated longitudinal sectional view. FIGS. 9A and 9B are enlarged plan views of the semiconductor device of FIGS. 8A and 8B. In these drawings, elements in common with elements in FIGS. 1A to 6C, which illustrate the first through fourth embodiments, are designated by common reference numerals.

In this semiconductor device having the multi-chip package configuration, semiconductor chips 40-1 and 40-2 that have the same structure as the semiconductor chip 40 of FIGS. 1A to 1C are fixed to the upper surface and the undersurface of the die pad 31 using the lead frame 30 of FIGS. 1A to 1C. The same relay chip 50 of FIGS. 1A to 1C is fixed with the same binding material 45 of FIGS. 1A to 1C to fit within an outer periphery of an upper surface of the semiconductor chip 40-1 disposed on the upper surface of the die pad 31. A relay chip 50D, which is different from the relay chip 50 of FIGS. 1A to 1C and has a multilayer interconnection structure, is fixed with a binding material 45-2, which is the same as the binding material 45 of FIGS. 1A to 1C, to fit within an outer periphery of an upper surface of the semiconductor chip 40-2 disposed on the undersurface of the die pad 31.

The relay chip 50D fixed on the upper surface of the semiconductor chip 40-2 on the undersurface of the die pad 31 has a multi-layer interconnection structure such as the one shown in FIG. 3, and third bonding pads 51 (upper-side bonding pads 51-11, 51-12, ..., lower-side bonding pads 51-21, 51-22, ..., left-side bonding pads 51-31, 51-32, ..., and right-side bonding pads 51-41, 51-42, ...) are disposed near four edges of an upper surface of the relay chip 50D. The bonding pads 51 are interconnected by the wiring pattern 52D having the multi-layer interconnection structure so that the wiring is reversed upwards, downwards, rightwards, and leftwards with respect to the wiring pattern 52 of the semiconductor chip 40-1 on the upper surface of the die pad 31.

That is, in the relay chip 50D, the left half of the upper-side bonding pads 51-11, 51-12, ... is connected to the right half of the same, the left-half of the lower-side bonding pads 51-21, 51-22, ... is connected to the right half of the same, and the left-side bonding pads 51-31, 51-32, ... are connected to the right-side bonding pads 51-41, 51-42, ...

Additionally, in the bonding pads 51 of the relay chip 50, the upper-side bonding pads 51-11, 51-12, ... are connected to the upper-side bonding pads 41-11, 41-12, ... of the semiconductor chip 40-1 by wires 61-1, and the lower-side bonding pads 51-21, 51-22, ... are connected to the lower-side bonding pads 41-21, 41-22, ... of the semiconductor chip 40-1 by the wires 61-1. Moreover, the left-side bonding pads 51-31, 51-32, ... are connected to the bonding pads 33-11, 33-12, ... of the lead frame 30 by plural wires 62-1, and the right-side bonding pads 51-41, 51-42, ... are connected to the bonding pads 33-21, 33-22, ... of the lead frame 30 by the plural wires 62-1.

Also, in the bonding pads 51 of the relay chip 50D on the undersurface, the upper-side bonding pads 51-11, 51-12, ... are connected to the upper-side bonding pads 41-21, 41-22, ... of the semiconductor chip 40-2 by the wires 61-2, and the lower-side bonding pads 51-21, 51-22, ... are connected to the lower-side bonding pads 41-11, 41-12, ... of the semiconductor chip 40-2 by the wires 61-2. Moreover, the left-side bonding pads 51-31, 51-32, ... are connected to the bonding pads 33-21, 33-22, ... of the lead frame 30 by the wires 62-2, and the right-side bonding pads 51-41, 51-42, ... are connected to the bonding pads 33-11, 33-12, ... of the lead frame 30 by the wires 62-2.

Therefore, the bonding pad 33-11 of the lead frame 30 is, for example, connected to the bonding pad 41-11 of the semiconductor chip 40-1 on the upper surface of the die pad 31 and connected to the bonding pad 41-11 of the semiconductor chip 40-2 on the undersurface of the die pad 31.

The semiconductor chips 40-1 and 40-2, the relay chips 50 and 50D, and the wires 61-1, 61-2, 62-1 and 62-2 are resin-sealed with the resin member 70 in the same manner as in FIGS. 1A to 1C. Other structures and operations are substantially the same as those of FIGS. 1A to 1C.

(Method of Production)

The semiconductor chip 40-1 is fixed to the upper surface of the die pad 31, and the semiconductor chip 40-2, which has the same structure as that of the semiconductor chip 40-1, is fixed to the undersurface of the die pad 31 in a chip-mounting step in a manner substantially the same as that of FIGS. 6A to 6C. The relay chip 50 is fixed by the binding material 45-1 in a mounting step to fit within the outer periphery of the upper surface of the semiconductor chip 40-1, and the relay chip 50D is fixed by the binding material 45-2 in the mounting step to fit within the outer periphery of the upper surface of the semiconductor chip 40-2. Next, the bonding pads 41 of the semiconductor chip 40-1 on the upper surface of the die pad 31 are connected to the bonding pads 51 of the relay chip 50 by the wires 61-1 in a wire-bonding step, and these bonding pads 51 are connected to the bonding pads 33 of the lead frame 30 by the wires 62-1.

The bonding pads 41 of the semiconductor chip 40-2 on the undersurface of the die pad 31 are connected to the bonding pads 51 of the relay chip 50D by the wires 61-2, and these bonding pads 51 are connected to the bonding pads 33 of the lead frame 30 by the wires 62-2. Thereafter, the semiconductor chips 40-1 and 40-2, the relay chips 50 and 50D, and the wires 61-1, 61-2, 62-1 and 62-2 are resin-sealed with the resin member 70, and production of the semiconductor device of FIGS. 8A to 8C is finished when processes substantially the same as those of FIGS. 6A to 6C are conducted.

(Effects)

In the fifth embodiment, there are effects that are substantially the same as effects (a) to (e) of the first embodiment, such as there being no need to create the conventional semiconductor chip 20B of FIGS. 15A and 15B. There are also effects that are substantially the same as effects (1) and (3) of the fourth embodiment, such as there being no need to create a mirror chip.

Sixth Embodiment (Structure)

Figure 10B:
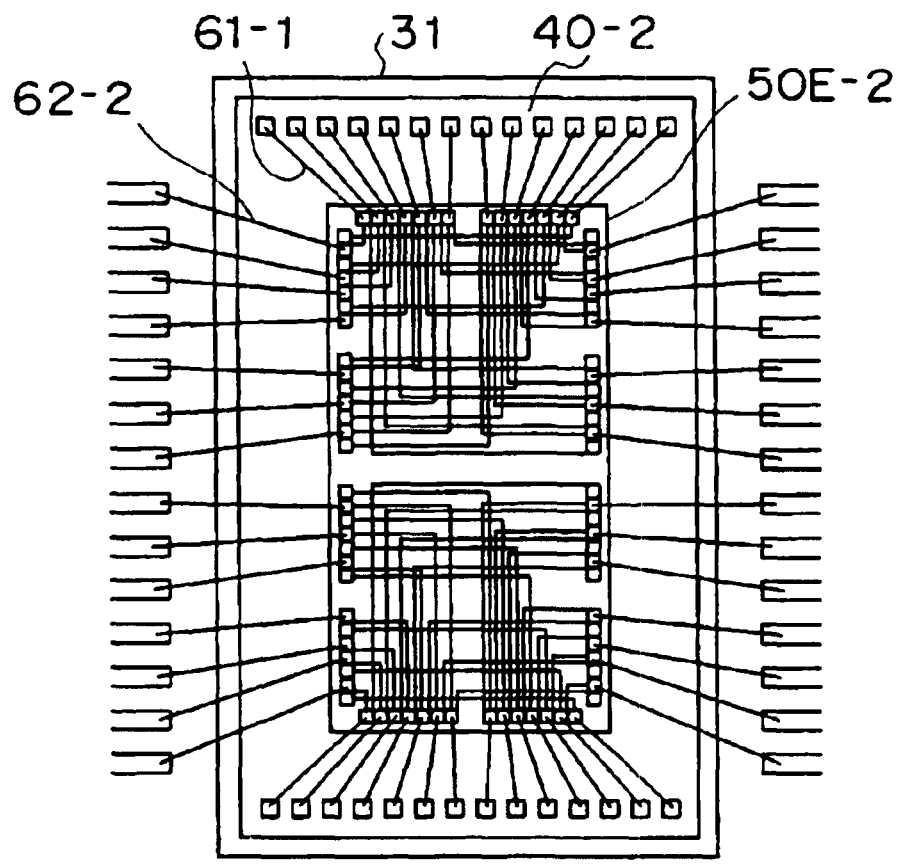
Figure 10C:
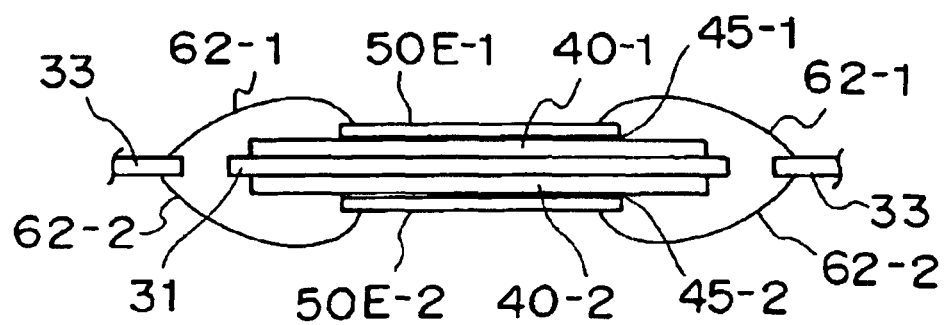

FIGS. 10A to 10C are schematic structural views of a semiconductor device having a multi-chip package configuration according to a sixth embodiment of the invention. FIG. 10A is an abbreviated plan view seen from an upper surface. FIG. 10B is an abbreviated bottom view seen from an undersurface. FIG. 10C is an abbreviated longitudinal sectional view. FIGS. 11A and 11B are enlarged plan views of the semiconductor device of FIGS. 10A and 10B. In these drawings, elements in common with elements in FIGS. 1A to 1C and 8A to 8C, which illustrate the first and fifth embodiments, are designated by common reference numerals.

In this semiconductor device having the multi-chip package configuration, semiconductor chips 40-1 and 40-2 that have the same structure as the semiconductor chips 40-1 and 40-2 of FIGS. 8A to 8C are fixed to the upper surface and the undersurface of the die pad 31 of the lead frame 30 of FIGS. 1A to 1C. Substantially rectangular relay chips 50E-1 and 50E-2, which share the same structure, are fixed with the same binding materials 45-1 and 45-2 of FIGS. 8A to 8C to fit within outer peripheries of upper surfaces of the semiconductor chips 40-1 and 40-2 respectively disposed on the upper surface and the undersurface of the die pad 31.

Each of the relay chips 50E-1 and 50E-2 respectively disposed on the upper and lower sides (with respect to the die pad 31) has a multi-layer interconnection structure such as the one shown in FIG. 3, and third bonding pads 51 (upper-side bonding pads 51-11, 51-12, . . . , lower-side bonding pads 51-21, 51-22, . . . , left-side bonding pads 51-31, 51-32, . . . , and right-side bonding pads 51-41, 51-42, . . . ) are disposed near four edges of each upper surface of the relay chips 50E-1 and 50E-2. The bonding pads 51 of the relay chip 50E-1 are interconnected by a wiring pattern 52E-1 that has a multi-layer interconnection structure, and the plural bonding pads 51 of the relay chip 50E-2 are interconnected by a wiring pattern 52E-2 that has a multi-layer interconnection structure.

That is, in each of the relay chips 50E-1 and 50E-2, bonding pads 51 within the left half of the upper-side bonding pads 51-11, 51-12, . . . are connected to bonding pads 51 within the right half of the upper-side bonding pads 51-11, 51-12, . . . and to bonding pads 51 within the upper half of the left-side bonding pads 51-31, 51-32, . . . . Bonding pads 51 within the right half of the upper-side bonding pads 51-11, 51-12, . . . are connected to bonding pads 51 within the left half of the upper-side bonding pads 51-11, 51-12, . . . , to bonding pads 51 within the upper half of the left-side bonding pads 51-31, 51-32, . . . , and to bonding pads 51 within the upper half of the right-side bonding pads 51-41, 51-42, . . . .

Bonding pads 51 within the left half of the lower-side bonding pads 51-21, 51-22, . . . are connected to bonding pads 51 within the right half of the lower-side bonding pads 51-21, 51-22, . . . and to bonding pads 51 within the lower half of the left-side bonding pads 51-31, 51-32, . . . . Bonding pads 51 within the right half of the lower-side bonding pads 51-21, 51-22, . . . are connected to bonding pads 51 within the left half of the lower-side bonding pads 51-21, 51-22, . . . , to bonding pads 51 within the lower half of the left-side bonding pads 51-31, 51-32, . . . , and to bonding pads 51 within the lower half of the right-side bonding pads 51-41, 51-42, . . .

Additionally, in the plural bonding pads 51 of the relay chip 50E-1, the upper-side bonding pads 51-11, 51-12, . . . are connected to the upper-side bonding pads 41-11, 41-12, . . . of the semiconductor chip 40-1 by wires 61-1, and the lower-side bonding pads 51-21, 51-22, . . . are connected to the lower-side bonding pads 41-21, 41-22, . . . of the semiconductor chip 40-1 by the wires 61-1. The left-side bonding pads 51-31, 51-32, . . . are connected to the bonding pads 33-11, 33-12, . . . of the lead frame 30 by wires 62-1, and the right-side bonding pads 51-41, 51-42, . . . are connected to the bonding pads 33-21, 33-22, . . . of the lead frame 30 by wires 62-1.

In the plural bonding pads 51 of the relay chip 50E-2, the upper-side bonding pads 51-11, 51-12, . . . are connected to the upper-side bonding pads 41-21, 41-22, . . . of the semiconductor chip 40-2 by wires 61-2, and the lower-side bonding pads 51-21, 51-22, . . . are connected to the lower-side bonding pads 41-11, 41-12, . . . of the semiconductor chip 40-2 by the wires 61-2. The left-side bonding pads 51-31, 51-32, . . . are connected to the bonding pads 33-21, 33-22, . . . of the lead frame 30 by wires 62-2, and the right-side bonding pads 51-41, 51-42, . . . are connected to the bonding pads 33-11, 33-12, . . . of the lead frame 30 by wires 62-2.

Thus, the bonding pad 33-11 of the lead frame 30 is, for example, connected to the bonding pad 41-11 of the semiconductor chip 40-1 on the upper surface of the die pad 31 and to the bonding pad 41-11 of the semiconductor chip 40-2 on the undersurface of the die pad 31.

The semiconductor chips 40-1 and 40-2, the relay chips 50E-1 and 50E-2, and the wires 61-1, 61-2, 62-1 and 62-2 are resin-sealed with the resin member 70 in the same manner as in FIGS. 1A to 1C and 8A to 8C. Other structures and operations are substantially the same as those of FIGS. 1A to 1C and 8A to 8C.

(Method of Production)

The semiconductor chip 40-1 is fixed to the upper surface of the die pad 31, and the semiconductor chip 40-2, which has the same structure as that of the semiconductor chip 40-1, is fixed to the undersurface of the die pad 31 in a chip-mounting step in a manner substantially the same as that of FIGS. 8A to 8C. The relay chip 50E-1 is fixed by the binding material 45-1 in a mounting step to fit within the outer periphery of the upper surface of the semiconductor chip 40-1, and the relay chip 50E-2 is fixed by the binding material 45-2 in the mounting step to fit within the outer periphery of the upper surface of the semiconductor chip 40-2. Next, several of the bonding pads 41 of the semiconductor chip 40-1 on the upper surface are connected to several of the bonding pads 51 of the relay chip 50E-1 by the wires 61-1 in a wire-bonding step, and several other of these bonding pads 51 are connected to the bonding pads 33 of the lead frame 30 by the wires 62-1.

Several of the bonding pads 41 of the semiconductor chip 40-2 on the undersurface are connected to several of the bonding pads 51 of the relay chip 50E-2 by the wires 61-2, and several other of these bonding pads 51 are connected to the bonding pads 33 of the lead frame 30 by the wires 62-2.

Thereafter, the semiconductor chips 40-1 and 40-2, the relay chips 50E-1 and 50E-2, and the wires 61-1, 61-2, 62-1 and 62-2 are resin-sealed with the resin member 70, and production of the semiconductor device of FIGS. 10A to 10C is finished when processes substantially the same as those of FIGS. 8A to 8C are conducted.

(Effects)

In the sixth embodiment, there are the following effects (A) to (D).

(A) There are effects that are substantially the same as effects (a) to (e) of the first embodiment, such as there being no need to create the conventional semiconductor chip 20B of FIGS. 15A and 15B.

(B) There are effects that are substantially the same as effects (1) and (3) of the fourth embodiment, such as there being no need to create a mirror chip.

(C) Production of a semiconductor device having a multi-chip package configuration becomes possible with the one kind of relay chips 50E-1 and 50E-2. Moreover, because the main parts of conventional semiconductor devices can be used without modification, new peripheral devices are not necessary when conducting blocking or the like for testing, and costs can be greatly reduced.

(D) Although upper/lower are distinguished by using the bonding pads 33 of the lead frame 30 and the bonding pads 51 of the relay chips 50E-1 and 50E-2 connected by the wires 62-1 and 62-2, upper/lower may also be distinguished by using the bonding pads 40 of the semiconductor chips 401 and 40-2 and the bonding pads 51 of the relay chips 50E-1 and 50E-2 connected by the wires 61-1 and 61-2.

Seventh Embodiment (Structure)

Figure 12A:
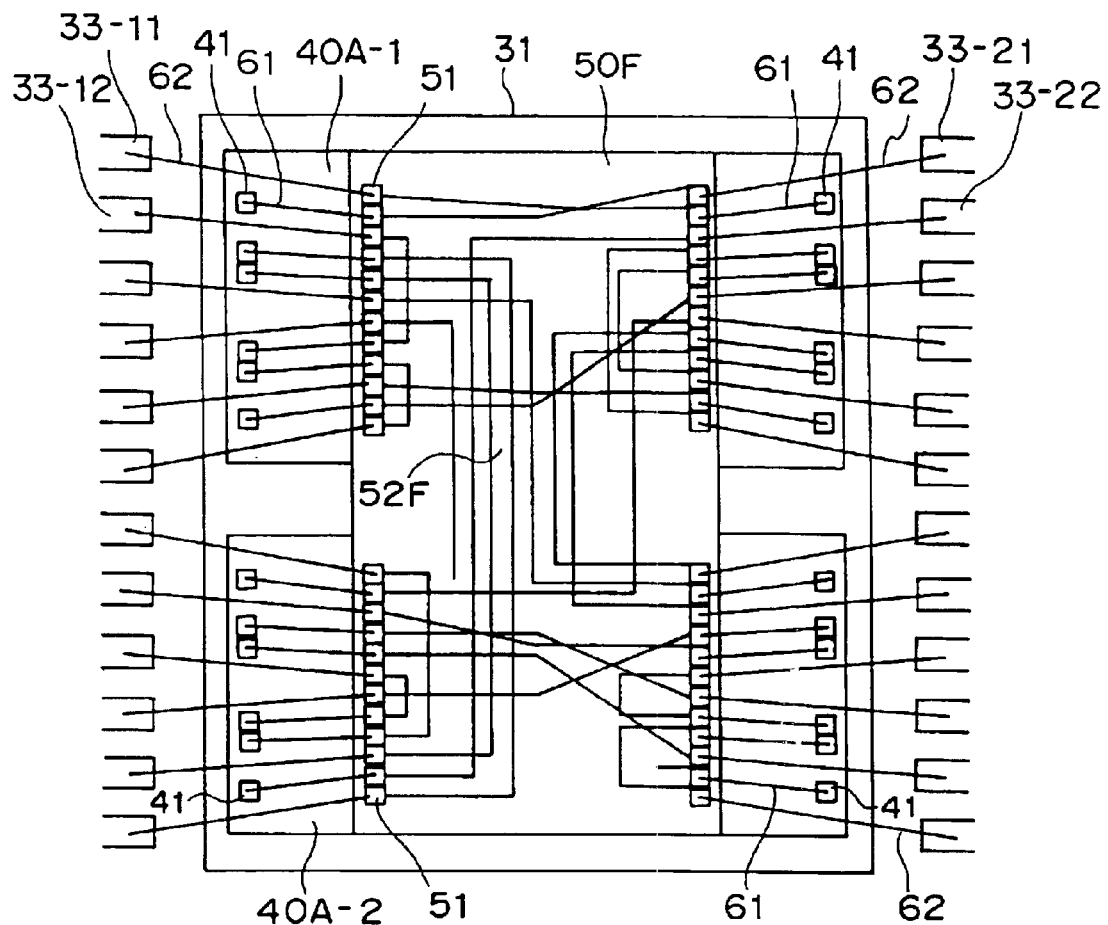
FIGS. 12A and 12B are schematic structural views of a semiconductor device according to a seventh embodiment of the invention.
Figure 12B:
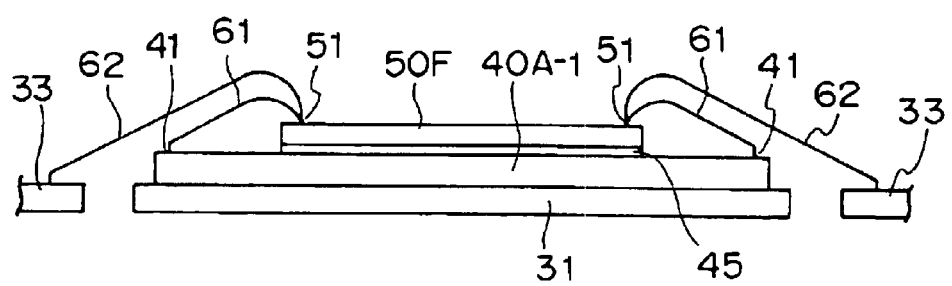

FIGS. 12A and 12B are schematic structural views of a semiconductor device having a multi-chip package configuration according to a seventh embodiment of the invention. FIG. 12A is an abbreviated plan view seen from an upper surface. FIG. 12B is an abbreviated longitudinal sectional view. Elements in common with elements in FIGS. 1A to 1C, which illustrate the first embodiment, are designated by common reference numerals.

In this semiconductor device having the multi-chip package configuration, plural (e.g., 2) semiconductor chips 40A-1 and 40A-2, which are substantially rectangular in plan view, are fixed to the upper surface of the die pad 31 of the lead frame 30 of FIGS. 1A to 1C. One relay chip 50F, which is substantially rectangular in plan view, is fixed with the same binding material 45 of FIGS. 1A to 1C to fit within an outer periphery of a single region formed by the semiconductor chips 40A-1 and 40A-2.

Bonding pads 41 are disposed near two opposing edges on upper surfaces of each of the semiconductor chips 40A-1 and 40A-2. The relay chip 50F is disposed with bonding pads 51 near two opposing edges on the upper surface of the relay chip 50F to correspond to the bonding pads 41 of the semiconductor chips 40A-1 and 40A-2. The bonding pads 51 are interconnected by a wiring pattern 52F that has a multi-layer interconnection structure such as the one shown in FIG. 3.

Several of the bonding pads 51 of the relay chip 50F are connected to the bonding pads 41 of the semiconductors 40A-1 and 40A-2 by wires 61, and several other of the bonding pads 51 are connected to the bonding pads 33 (33-1, 33-2, . . . ) of the lead frame 30 by wires 62.

The semiconductor chips 40A-1 and 40A-2, the relay chip 50F, and the wires 61 and 62 are resin-sealed with the resin member 70 in the same manner as in FIGS. 1A to 1C. Other structures and operations are substantially the same as those of FIGS. 1A to 1C.

(Method of Production)

Undersurfaces of the semiconductor chips 40A-1 and 40A-2 are fixed to the upper surface of the die pad 31 in a chip-mounting step in a manner substantially the same as that of FIGS. 1A to 1C. The relay chip 50F is fixed by the binding material 45 in a mounting step to fit within the outer periphery of the single region formed by the semiconductor chips 40A-1 and 40A-2. Next, several of the bonding pads 41 of the semiconductor chips 40A-1 and 40A-2 are connected to several of the bonding pads 51 of the relay chip 50F by the wires 61 in a wire-bonding step, and several other of these bonding pads 51 are connected to the bonding pads 33 (33-1, 33-2, . . . ) of the lead frame 30 by the wires 62.

Thereafter, the semiconductor chips 40A-1 and 40A-2, the relay chip 50F, and the wires 61 and 62 are resin-sealed with the resin member 70, and production of the semiconductor device of FIGS. 12A and 12B is finished when processes substantially the same as those of FIGS. 1A to 1C are conducted.

(Effects)

In the seventh embodiment, there are the following effects (I) to (V).

(I) The relay chip 50F is superimposed on the semiconductor chips 40A-1 and 40A-2, and the direction in which the pads are disposed is converted using the relay chip 50F so that the pads can be connected to the bonding pads 33 of the lead frame 30. Thus, a semiconductor device having a multi-chip package configuration can be produced without constraints on the disposition of the pads.

(II) Because the relay chip 50F comprises only the bonding pads 51 and the wiring pattern 52F having the multi-layer interconnection structure, it is possible to reduce developmental expenses or expenses necessary to redesign and test the operation of a semiconductor chip in comparison with a case in which a semiconductor chip is created where the disposition of the pads is altered.

(III) Because the relay chip 50F is fixed within the outer periphery of the single region formed by the semiconductor chips 40A-1 and 40A-2, it is possible to strongly fix the relay chip 50F at a predetermined position. Therefore, it is possible to easily and accurately mount and wire-bond the relay chip 50F without the relay chip 50F deviating from the predetermined mounting position due to force applied thereto when the relay chip 50F is mounted and wire-bonded.

(IV) When a material having an impact-buffering function is used as the binding material 45, or when an impact-buffering pad is separately disposed between the semiconductor chips 40A-1 and 40A-2 and the relay chip 50F, it is possible to minimize impact force on the semiconductor chips 40A-1 and 40A-2 and to thereby reduce failure rate of the semiconductor chips 40A-1 and 40A-2 when the relay chip 50F is fixed.

(V) Three or more of the semiconductor chips 40A-1 and 40A-2 may be disposed. The wiring pattern 52F of the relay chip 50F can also be variously configured to correspond to the direction in which the disposition of the pads is converted.

Eighth Embodiment (Structure)

Figure 13A:
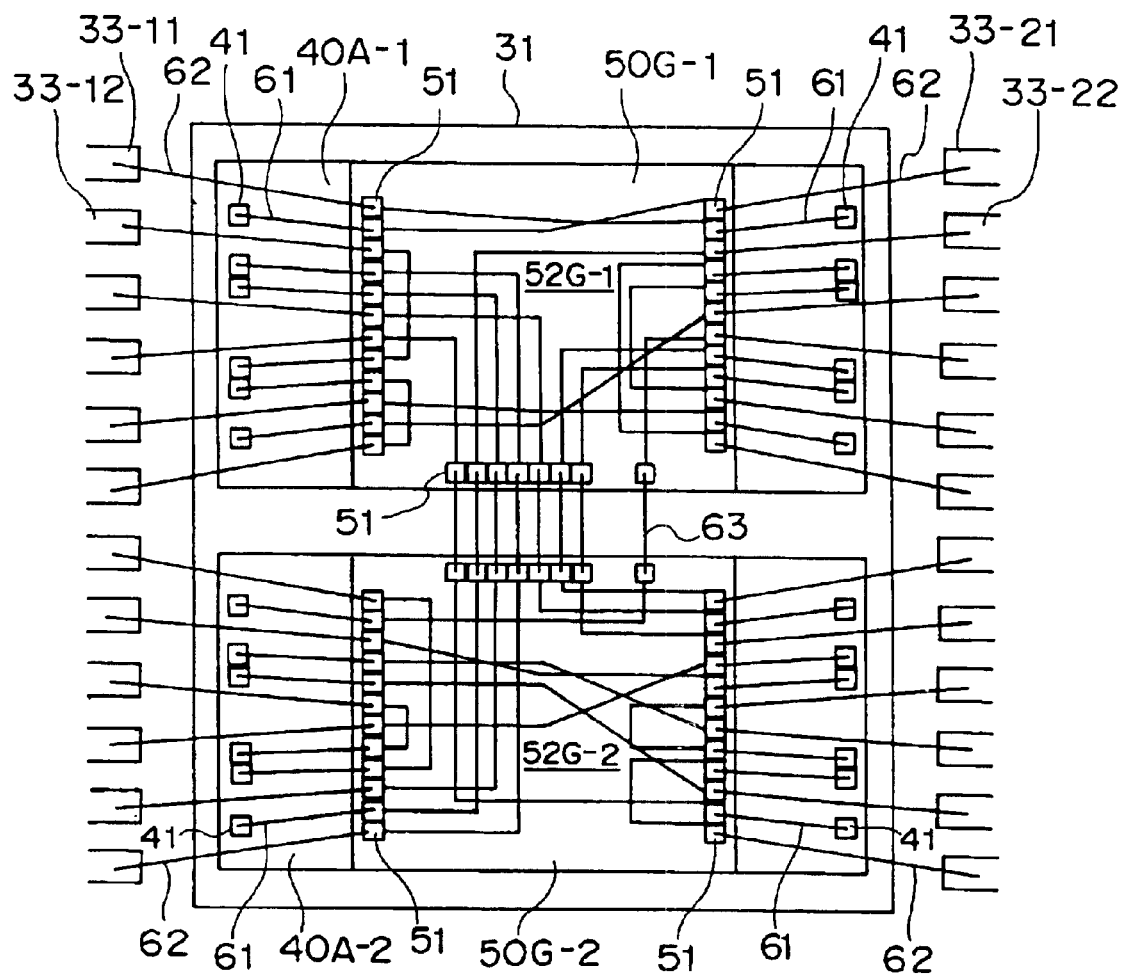
FIGS. 13A and 13B are schematic structural views of a semiconductor device according to an eighth embodiment of the invention.
Figure 13B:
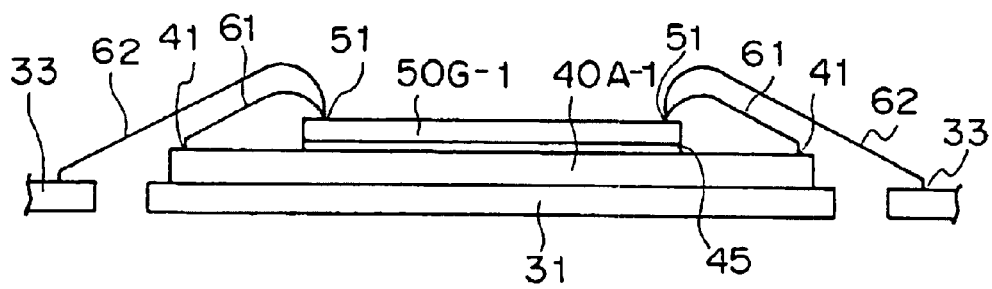
Figure 14A:
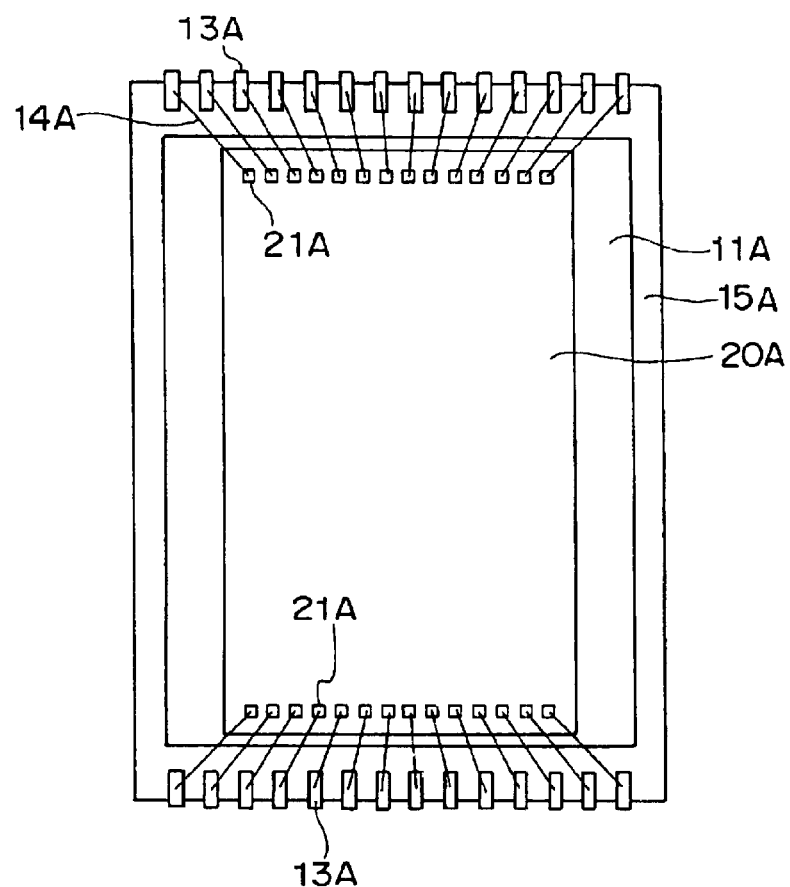
FIGS. 14A and 14B are schematic structural views of a conventional semiconductor device.
Figure 14B:
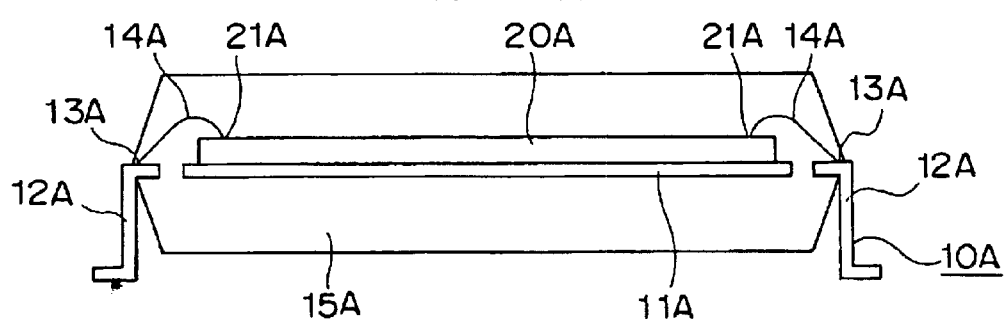

FIGS. 13A and 13B are schematic structural views of a semiconductor device having a multi-chip package configuration according to an eighth embodiment of the invention. FIG. 13A is an abbreviated plan view seen from an upper surface. FIG. 13B is an abbreviated longitudinal sectional view. Elements in common with elements in FIGS. 1A to 1C and 8A to 8C, which illustrate the first and seventh embodiments, are designated by common reference numerals.

In this semiconductor device having the multi-chip package configuration, plural (e.g., 2) semiconductor chips 40A-1 and 40A-2, which have the same structure as those of FIGS. 12A and 12B, are fixed to the upper surface of the die pad 31 of the lead frame 30 of FIGS. 1A to 1C. Relay chips 50G-1 and 50G-2, which are substantially rectangular in plan view, are fixed with the same binding material 45 of FIGS. 1A to 1C to fit within outer peripheries of upper surfaces of the semiconductor chips 40A-1 and 40A-2.

Each of the relay chips 50G-1 and 50G-2 fixed on the semiconductor chips 40A-1 and 40A-2 is disposed with bonding pads 51 near two opposite edges on upper surfaces thereof to correspond to the bonding pads 41 of the semiconductor chips 40A-1 and 40A-2. Moreover, bonding pads 51 are also disposed as needed near another edge of each of the relay chips 50G-1 and 50G-2. The bonding pads 51 are interconnected by wiring patterns 52G-1 and 52G-2 that have a multi-layer interconnection structure such as the one shown in FIG. 3.

Several of the bonding pads 51 of the relay chips 50G-1 and 50G-2 are connected to the bonding pads 41 of the semiconductors 40A-1 and 40A-2 by plural wires 61, and several other of the bonding pads 51 are connected to the bonding pads 33 (33-11, 33-12, . . . ) of the lead frame 30 by wires 62. When it is necessary to connect the relay chip 50G-1 to the relay chip 50G-2, the bonding pads 51 of the relay chip 50G-1 may be connected to the bonding pads 51 of the relay chip 50G-2 with wires 63.

The semiconductor chips 40A-1 and 40A-2, the relay chips 50G-1 and 50G-2, and the wires 61, 62 and 63 are resin-sealed with the resin member 70 in the same manner as in FIGS. 1A to 1C and in FIGS. 12A and 12B. Other structures and operations are substantially the same as those of FIGS. 1A to 1C and FIGS. 12A and 12B.

(Method of Production)

Undersurfaces of the semiconductor chips 40A-1 and 40A-2 are fixed to the upper surface of the die pad 31 in a chip-mounting step in a manner substantially the same as that of FIGS. 1A to 1C and FIGS. 12A and 12B. The relay chips 50G-1 and 50G-2 are fixed by the binding material 45 in a mounting step to fit respectively within the outer peripheries of the upper surfaces of the semiconductor chips 40A-1 and 40A-2.

Next, several of the bonding pads 41 of the semiconductor chips 40A-1 and 40A-2 are connected to several of the bonding pads 51 of the relay chips 50G-1 and 50G-2 by the wires 61 in a wire-bonding step, and several other of these bonding pads 51 are connected to the bonding pads 33 (33-11, 33-12, . . . ) of the lead frame 30 by the wires 62. When it is necessary to connect the relay chip 50G-1 to the relay chip 50G-2, the bonding pads 51 of the relay chip 50G-1 are connected to the bonding pads 51 of the relay chip 50G-2 with the wires 63.

Thereafter, the semiconductor chips 40A-1 and 40A-2, the relay chips 50G-1 and 50G-2, and the wires 61, 62 and 63 are resin-sealed with the resin member 70, and production of the semiconductor device of FIGS. 13A and 13B is finished when processes substantially the same as those of FIGS. 1A to 1C and FIGS. 12A and 12B are conducted.

(Effects)

In the eighth embodiment, there are the effects (I) to (V) of the seventh embodiment and the following effect (VI).

(VI) Because the sizes of the relay chips 50G-1 and 50G-2 are small as a result of dividing the relay chip 50F of FIGS. 12A and 12B into the relay chips 50G-1 and 50G-2, in comparison to the relay chip 50 of the first embodiment, wire breakage and the like are reduced and chip yield is improved, whereby it becomes possible to lower costs.

(Modes of Utilization)

The present invention is not limited to the aforementioned embodiments, and many modifications and modes of utilization are possible. Examples of such modifications and modes of utilization include the following (i) to (iii).

(i) Although description was given in the embodiments of the Small Outline Package, it is also possible to use other packages like the Quad Flat Package by changing the pull-out configuration of the outer lead portions of the lead frame 30. Packages other than a resin-sealed package, such as a hollow package, may also be used.

(ii) Although description was given of an example in which the die pad 31 of the lead frame 30 was used as the substrate for mounting a semiconductor chip, other substrates, such as a wiring substrate, a semiconductor substrate, or a glass epoxy substrate may also be used.

(iii) The dispositions of the pads and the wiring patterns of the relay chips are examples and can be variously configured to correspond to the direction in which the pads are disposed and the like. Also, production methods and production materials can be optionally changed.

What is claimed is:

1. A semiconductor device comprising:

a substrate including a first surface and a second surface;

first bonding pads disposed spaced from the substrate near a periphery of the substrate;

a semiconductor chip including an upper surface disposed with second bonding pads and an undersurface mounted on the substrate first surface;

at least one relay chip including (1) an upper surface disposed with third bond pads, (2) a first wiring pattern formed of wiring for connecting corresponding pad pairs of the third bonding pads, and (3) an undersurface mounted on the upper surface of the semiconductor chip; and lead wires for electrically connecting the first bonding pads and the second bonding pads via the first wiring pattern and the third bonding pads of the at least one relay chip, wherein one first bonding pad and one of a pad pair of third bonding pads corresponding to the one first bonding pad are electrically connected via one lead wire, and another of the pad pair of third bonding pads and a second bonding pad corresponding to the other of the pad pair of third bonding pads are electrically connected via another lead wire.

2. The semiconductor device of claim 1, wherein the number of relay chips is plural and the relay chips have substantially the same structure.

3. The semiconductor device of claim 1, wherein the first wiring pattern includes a multi-layer interconnection structure comprising interlayer insulating films and conductive films that are alternatingly disposed.

4. The semiconductor device of claim 1, wherein the substrate is a die pad of a lead frame.

5. The semiconductor device of claim 1, further comprising:
   a second semiconductor chip including an upper surface disposed with bonding pads and an undersurface mounted on the substrate second surface; and
   lead wires for electrically connecting said bonding pads of said second semiconductor upper surface to the first bonding pads.

6. The semiconductor device of claim 5, wherein the second semiconductor chip has substantially the same structure as that of the semiconductor chip.

7. A semiconductor device comprising:
   a substrate including a first surface and a second surface;
   first bonding pads disposed outside the substrate near a periphery of the substrate;
   a semiconductor chip including an upper surface disposed with second bonding pads and an undersurface mounted on the substrate first surface;
   at least one relay chip including (1) an upper surface disposed with third bond pads, (2) a first wiring pattern formed of wiring for connecting corresponding pad pairs of the third bonding pads, and (3) an undersurface mounted on the upper surface of the semiconductor chip;
   lead wires for electrically connecting the first bonding pads and the second bonding pads of the semiconductor chip, wherein one first bonding pad and one third bonding pad corresponding to the one first bonding pad are electrically connected via one lead wire, and another third bonding pad connected via one wiring to the one third bonding pad and a second bonding pad corresponding to the another third bonding pad are electrically connected via another lead wire;
   a second semiconductor chip including an upper surface disposed with fourth bonding pads and an undersurface mounted on the substrate second surface;
   a second relay chip including (1) an upper surface disposed with fifth bonding pads, (2) a second wiring pattern formed of wiring for connecting corresponding pad pairs of the fifth bonding pads, and (3) an undersurface mounted on the upper surface of the second semiconductor chip; and
   lead wires for electrically connecting the first bonding pads and the fourth bonding pads of the second semiconductor chip;
   wherein one first bonding pad and one fifth bonding pad corresponding to the one first bonding pad are electrically connected via one lead wire, and another fifth bonding pad connected via one wiring to the one fifth bonding pad and a fourth bonding pad corresponding to the another fifth bonding pad are electrically connected via another lead wire.

8. The semiconductor device of claim 7, wherein the second wiring pattern is substantially the same as the first wiring pattern.

9. The semiconductor device of claim 7, wherein the second wiring pattern is substantially different from the first wiring pattern.

10. A semiconductor device comprising:
    a substrate;
    first bonding pads disposed spaced from the substrate near a periphery of the substrate;
    plural semiconductor chips, each semiconductor chip including an upper surface disposed with second bonding pads and an undersurface mounted on a surface of the susbstrate;
    a relay chip including (1) an upper surface disposed with third bonding pads, (2) a wiring pattern formed of wiring for connecting corresponding pad pairs of third bonding pads, and (3) an undersurface mounted on the upper surfaces of the semiconductor chips; and
    lead wires for electrically connecting the first bonding pads and the second bonding pads via the wiring pattern and the third bonding pads of the relay chip,
    wherein one first bonding pad and one of a pad pair of third bonding pads corresponding to the one first bonding pad are electrically connected via one lead wire, and another of the pad pair of third bonding pads and a second bonding pad corresponding to the other of the pad pair of third bonding pads are electrically connected via another lead wire.

11. The semiconductor device of claim 10, wherein the relay chip is mounted so as to bridge the semiconductor chips.

12. The semiconductor device of claim 10, wherein the wiring pattern includes a multi-layer interconnection structure comprising interlayer insulating films and conductive films that are alternatingly disposed.

13. The semiconductor device of claim 10, wherein the substrate is a die pad of a lead frame.

14. The semiconductor device comprising:
    a substrate;
    first bonding pads disposed spaced from the substrate near a periphery of the substrate;
    plural semiconductor chips, each semiconductor chip including an upper surface disposed with second bonding pads and an undersurface mounted on a surface of the substrate;
    plural relay chips, each relay chip including (1) an upper surface disposed with third bonding pads, (2) a wiring pattern formed of wiring for connecting corresponding pad pairs of the third bonding pads, and (3) an undersurface mounted on the upper surface of the semiconductor chip corresponding thereto; and
    lead wires for electrically connecting the first bonding pads and the second bonding pads via the first wiring pattern and the third bonding pads of the plural relay chips, wherein one first bonding pad and one of a pad pair of third bonding pads corresponding to the one first bonding pad are electrically connected via one lead wire, and another of the pad pair of third bonding pads and a second bonding pad corresponding to the other of the pad pair of third bonding pads are electrically connected via another lead wire.

15. The semiconductor device of claim 14, wherein the third bonding pads of one relay chip are electrically interconnected to the third bonding pads of another relay chip via the lead wires.

16. The semiconductor device of claim 14, wherein the wiring pattern includes a multi-layer interconnection structure comprising interlayer insulating films and conductive films that are alternatingly disposed.

17. The semiconductor device of claim 14, wherein the substrate is a die pad of a lead frame.

18. The semiconductor of claim 1, wherein each relay chip includes a substrate comprising silicon.

* * * * *